(12) United States Patent
Kang et al.

(10) Patent No.: US 11,631,733 B2
(45) Date of Patent: *Apr. 18, 2023

(54) DISPLAY DEVICE

(71) Applicant: Samsung Display Co., LTD., Yongin-si (KR)

(72) Inventors: Jang Mi Kang, Seoul (KR); Cheol Gon Lee, Suwon-si (KR); Jae Yong Jang, Seoul (KR); Mee Hye Jung, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/466,254

(22) Filed: Sep. 3, 2021

(65) Prior Publication Data

US 2021/0399083 A1 Dec. 23, 2021

Related U.S. Application Data

(63) Continuation of application No. 16/997,420, filed on Aug. 19, 2020, now Pat. No. 11,114,520.

(30) Foreign Application Priority Data

Sep. 16, 2019 (KR) .................. 10-2019-0113672

(51) Int. Cl.
| | |
|---|---|
| *H01L 27/32* | (2006.01) |
| *G06F 3/044* | (2006.01) |
| *G06F 3/041* | (2006.01) |
| *H01L 51/52* | (2006.01) |

(52) U.S. Cl.
CPC ........ *H01L 27/3276* (2013.01); *G06F 3/0412* (2013.01); *G06F 3/0443* (2019.05); *G06F 3/0446* (2019.05); *H01L 27/323* (2013.01); *H01L 51/5281* (2013.01);
(Continued)

(58) Field of Classification Search
None
See application file for complete search history.

(56) References Cited

U.S. PATENT DOCUMENTS

| | | |
|---|---|---|
| 9,720,449 B2 | 8/2017 | Ko et al. |
| 2008/0150906 A1 | 6/2008 | Grivna |
| 2015/0138041 A1 | 5/2015 | Hirakata et al. |

(Continued)

FOREIGN PATENT DOCUMENTS

| | | |
|---|---|---|
| CN | 109658831 | 4/2019 |
| KR | 10-2020-0010697 | 1/2020 |

OTHER PUBLICATIONS

Extended European search report for European Patent Application or Patent No. 20196146.3 dated Feb. 12, 2021.

*Primary Examiner* — Duane N Taylor, Jr.
(74) *Attorney, Agent, or Firm* — Kile Park Reed & Houtteman PLLC

(57) ABSTRACT

A display device includes a display panel having a display area and a non-display area, signal wires disposed in the display area, connection wires disposed in the display area and electrically connected to the signal wires, and touch electrodes disposed on the connection wires. The connection wires include diagonal portions extending in a diagonal direction, and first protrusion patterns protruding from the diagonal portions of the connection wires. Parts of the first protrusion patterns overlap the touch electrodes.

20 Claims, 24 Drawing Sheets

(52) U.S. Cl.
CPC .............. *G06F 2203/04102* (2013.01); *G06F 2203/04112* (2013.01); *H01L 27/3246* (2013.01); *H01L 27/3265* (2013.01)

(56) References Cited

U.S. PATENT DOCUMENTS

| | | |
|---|---|---|
| 2016/0209952 A1 | 7/2016 | Lin et al. |
| 2017/0185193 A1 | 6/2017 | Kim |
| 2019/0088198 A1 | 3/2019 | Kang et al. |
| 2020/0201392 A1 | 6/2020 | Yu et al. |
| 2020/0371621 A1* | 11/2020 | Moon .................. G06F 3/0446 |

\* cited by examiner

TSP : TE, RE, BE

TSP : TE, RE, BE

TSP : TE, RE, BE
171 : ANO1, ANO21, ANO22, ANO3

DISPLAY DEVICE

CROSS REFERENCE TO RELATED APPLICATION(S)

This is a continuation application of U.S. patent application Ser. No. 16/997,420, filed Aug. 19, 2020 (now U.S. Pat. No. 11,114,520), the disclosure of which is incorporated herein by reference in its entirety. U.S. patent application Ser. No. 16/997,420 claims priority to and benefit of Korean Patent Application No. 10-2019-0113672 under 35 U.S.C. § 119, filed on Sep. 16, 2019, in the Korean Intellectual Property Office, the entire contents of which are incorporated herein by reference.

BACKGROUND

1. Technical Field

The disclosure relates to a display device.

2. Description of the Related Art

Importance of display devices has been increasing along with the development of multimedia. Various types of display devices, such as liquid crystal displays (LCDs) and organic light-emitting diode (OLED) displays, have been developed and are being in use. Among the various types of display devices, the OLED display is a self-light-emitting device that is considered as a popular display device owing to its technical perspectives such as a wide viewing angle.

An OLED display in general includes a pixel circuit and a driver configured to drive the pixel circuit. The driver may include a scan driver which provides scan signals to the pixel circuit, a data driver which provides data signals to the pixel circuit, and the like. Driving circuits of the scan driver and the data driver may be disposed in a non-display area adjacent to a display area. The non-display area is considered as a dead space in terms of functions of a display device.

SUMMARY

According to an embodiment of the disclosure, a display device may include a display panel comprising a display area and a non-display area, signal wires disposed in the display area, connection wires disposed in the display area and electrically connected to the signal wires, and touch electrodes disposed on the connection wires. The connection wires may comprise diagonal portions extending in a diagonal direction, and first protrusion patterns protruding from the diagonal portions of the connection wires. Parts of the first protrusion patterns may overlap the touch electrodes.

Adjacent ones of the parts of the first protrusion patterns may face each other, and a gap between the adjacent ones of the parts of the first protrusion patterns may overlap the touch electrodes.

A distance between the adjacent ones of the parts of the first protrusion patterns may be smaller than a line width of the touch electrodes.

The signal wires may extend in a first direction, and the first protrusion patterns may protrude in the first direction or a second direction intersecting the first direction.

The connection wires may further comprise second protrusion patterns protruding from an extension portion of the connection wires. The extension portion may include portions of the connection wires excluding the diagonal portions. Parts of the second protrusion patterns may overlap the touch electrodes.

Adjacent ones of the parts of the second protrusion patterns face each other, and a gap between the adjacent ones of the parts of the second protrusion patterns may overlap the touch electrodes.

A part of at least one of the first protrusion patterns and a prat of at least one of the second protrusion patterns may adjacent to each other, and a gap between the part of the at least one of the first protrusion patterns and the part of the at least one of the second protrusion patterns may overlap the touch electrodes.

The first protrusion patterns and the second protrusion patterns may be alternately disposed in the second direction, and an interval between the first protrusion patterns or between the second protrusion patterns may be substantially same as an interval between the connection wires disposed in the second direction.

A length of the first protrusion patterns in the first direction may be different from a length of the second protrusion patterns in the first direction.

The connection wires may comprise a first portion extending from the non-display area in a first direction, a second portion extending from an end of the first portion in a second direction intersecting the first direction, and a third portion extending from an end of the second portion in a direction opposite to the first direction.

The display device may include a first conductive layer including the signal wires, and a second conductive layer disposed on the first conductive layer and including the connection wires, and an insulating layer disposed between the first conductive layer and the second conductive layer. The connection wires may be in contact with the signal wires through a contact hole passing through the insulating layer.

The display device may further comprise a first electrode layer disposed on the second conductive layer, a second electrode layer disposed on the first electrode layer, and a light-emitting layer disposed between the first electrode layer and the second electrode layer.

The first portion may be electrically connected to the signal wires, and the third portion may be spaced apart from the first portion.

The display device may further comprise dummy patterns disposed at a side of the connection wires in the display area. The dummy pattern may comprise a diagonal portions extending in a diagonal direction.

The display device may further comprise first dummy protrusion patterns protruding from the diagonal portions of the dummy patterns, wherein a part of at least one of the first dummy protrusion patterns a part of at least one of the first protrusion patterns are adjacent to each other.

A gap between the part of the at least one of the first dummy protrusion patterns and the part of the at least one of the first protrusion patterns may overlap the touch electrodes.

A distance between the part of the at least one of the first dummy protrusion patterns and the part of the at least one of the first protrusion patterns may be smaller than a line width of the touch electrodes.

The dummy patterns the connection wires may be disposed on a same conductive layer.

The touch electrodes may be disposed in the display area and may further comprise first touch electrodes disposed in a first direction, and connection electrodes that may electrically connect the first touch electrodes.

The touch electrodes may further comprise second touch electrodes disposed in a second direction intersecting the first direction. The first touch electrodes and the second touch electrodes may be spaced apart from each other.

The display device may further comprise pixels disposed in the display area, and a pixel definition film that defines light-emitting areas of the pixels. The touch electrodes may overlap the pixel definition film.

BRIEF DESCRIPTION OF THE DRAWINGS

The above and other aspects and features of the disclosure will become more apparent by describing embodiments in detail with reference to the attached drawings, in which.

DETAILED DESCRIPTION OF THE EMBODIMENTS

Figure 1:
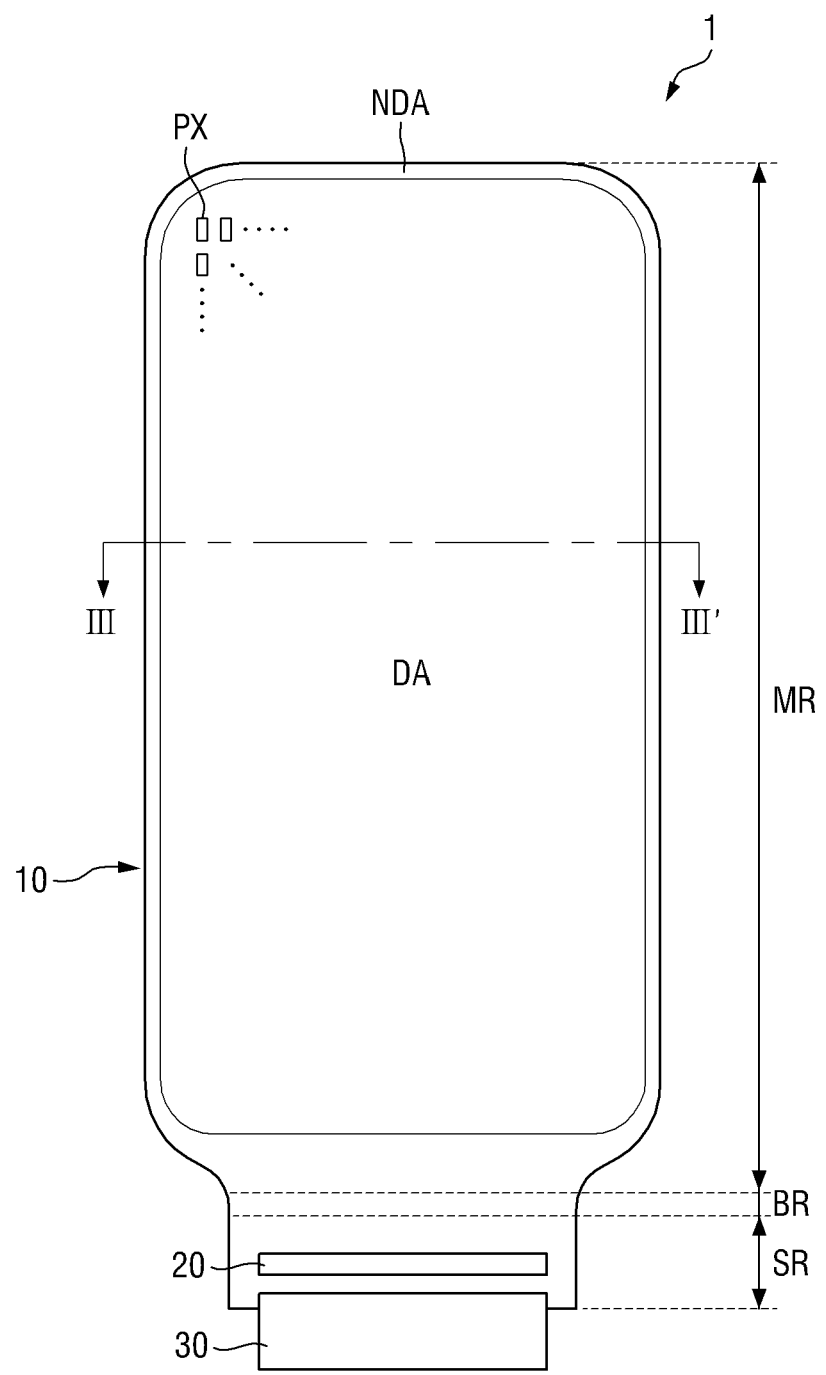
FIG. 1 is a plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
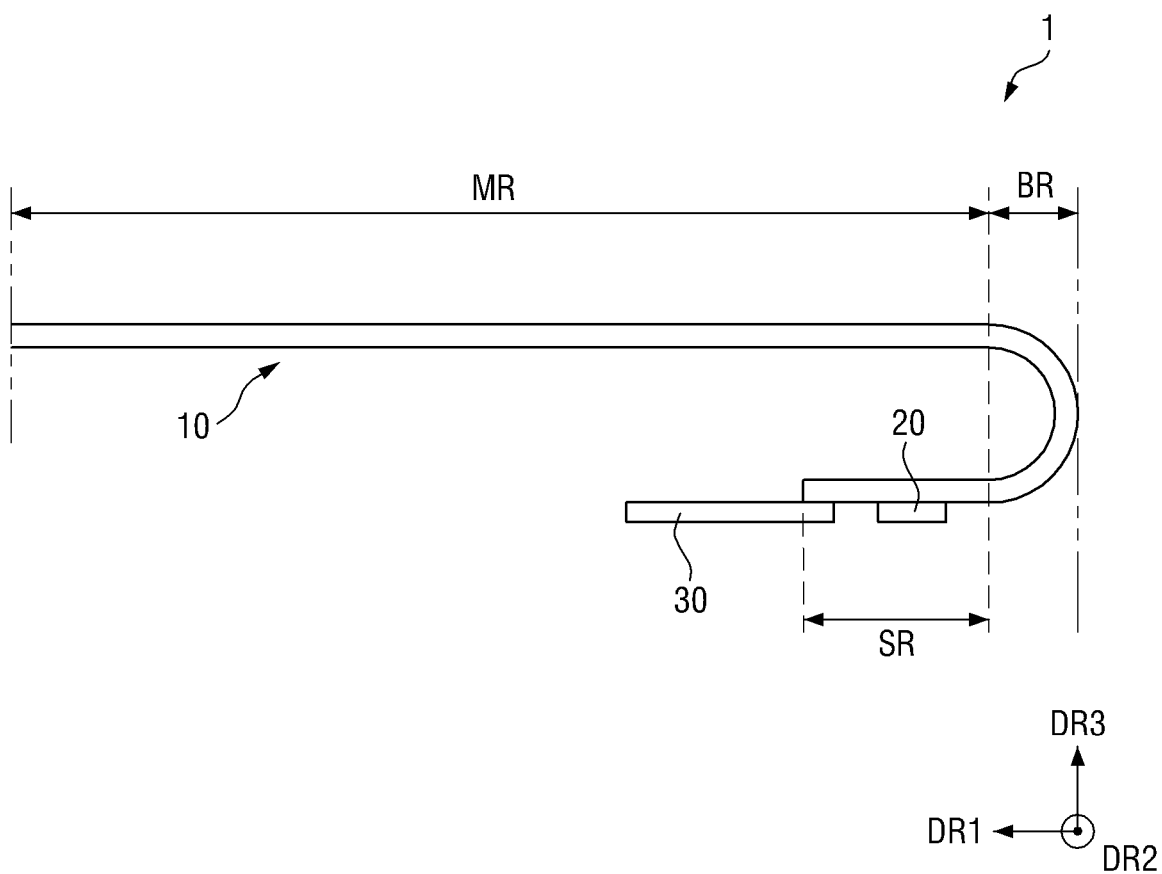
FIG. 2 is a side view illustrating the display device of FIG. 1.

FIG. 1 is a plan view illustrating a display device according to an embodiment. FIG. 2 is a side view illustrating the display device of FIG. 1.

Referring to FIGS. 1 to 2, a display device 1 is a device which displays images, for example, a still image or a moving image. The display device 1 may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra mobile PC (UMPC) and may also be used as a display screen of various products such as a television, a laptop computer, a monitor, a billboard, and a device for Internet of things (IoT).

The display device 1 may include a display panel 10. The display panel 10 may be a flexible substrate including a flexible polymer material such as polyimide. Accordingly, the display panel 10 may be flexible, bendable, foldable, and/or rollable.

The display panel 10 may include a display area DA in which an image is displayed and a non-display area NDA in which no image is displayed and which excludes the display area DA. The display area DA may include pixels PX.

The display panel 10 may include a main area MR and a bent area BR connected to a side of the main area MR. The display panel 10 may include a sub-area SR which is connected to the bent area BR and overlaps the main area MR in a thickness direction thereof The main area MR may include the display area DA. A peripheral edge portion around the display area DA of the main area MR may be the non-display area NDA.

The main area MR may have a planar shape which may be an exterior shape of the display device 1. The main area MR may be a flat area positioned on one surface. However, the disclosure is not limited thereto. For example, in the main area MR, at least one edge of the remaining edges except for an edge (side) connected to the bent area BR may be bent to form a curved surface or be bent in a vertical direction.

In the main area MR, when at least one edge of the remaining edges excluding the edge (side) connected to the bent area BR forms the curved surface or is bent, the display area DA may be disposed in or extended to the corresponding area. However, the disclosure is not limited thereto, For example, the non-display area NDA in which no image is displayed may be disposed at the curved or bent edge, or the display area DA and the non-display area NDA may be disposed together at the curved or bent edge.

The non-display area NDA of the main area MR may be disposed in an area from an outer boundary of the display area DA to an edge of the display panel 10. A signal wire DL, a connection wire DM, or a driving circuit for applying a signal to the display area DA may be disposed in the non-display area NDA of the main area MR. In addition, an outermost black matrix may be disposed in the non-display area NDA of the main area MR, but the disclosure is not limited thereto.

The bent area BR is connected to the main area MR. For example, the bent area BR may be connected to one short side of the main area MR. In the bent area BR, the display panel 10 may be bent with a curvature downward in a direction opposite to a third direction DR3, that is, in a direction opposite to a display surface. As the display panel 10 is bent in the bent area BR, a surface of the display panel 10 may be reversed. That is, one surface of the display panel 10 facing upward may be changed to face outward through the bent area BR and then face downward.

The sub-area SR extends from the bent area BR. The sub-area SR may extend from a side, at which the display panel 10 is bent (or completely bent), in a direction substantially parallel to the main area MR. The sub-area SR may overlap the main area MR in the third direction DR3, that is, in the thickness direction of the display panel 10. The sub-area SR may overlap the non-display area NDA of an edge of the main area MR and may further overlap the display area DA of the main area MR.

A driving chip 20 may be disposed in the sub-area SR of the display panel 10 (or a pad portion on which the driving chip 20 is disposed and which is electrically connected to the driving chip 20). The driving chip 20 may generate a driving signal necessary for driving the pixel PX and provide the driving signal to the pixel PX defined in the display area DA. For example, the driving chip 20 may generate a data signal for determining luminance of the pixel PX. The driving chip 20 may supply the data signal to the pixel PX through a connection wire DM and a signal wire DL (referring to FIG. 7).

The driving chip 20 may be attached onto the display panel 10 through an anisotropic conductive film or attached onto the display panel 10 through ultrasonic bonding. A width of the driving chip 20 in a second direction DR2 may be less than a width of the display panel 10 in the second direction DR2.

A driving substrate 30 may be connected to an end portion of the sub-area SR of the display panel 10. The pad portion may be provided at the end portion of the sub-area SR, and the driving substrate 30 may be connected onto the pad portion. The driving substrate 30 may be a flexible printed circuit board or film.

Figure 3:
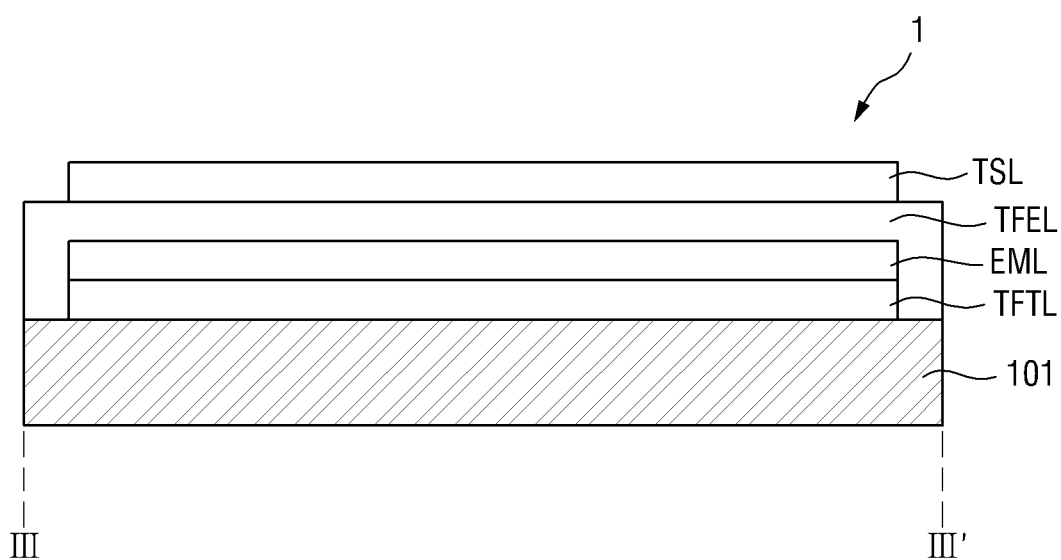
FIG. 3 is a schematic cross-sectional view taken along line III-III' of FIG. 1.
Figure 3:
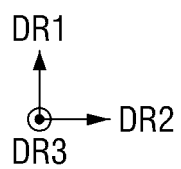

FIG. 3 is a schematic cross-sectional view taken along line III-III' of FIG. 1.

Referring to FIG. 3, the display device 1 may include a substrate 101, a thin film transistor layer TFTL, a light-emitting element layer EML, a thin film encapsulation layer TFEL, and a touch sensing layer TSL.

The substrate 101 may be a flexible substrate which is bendable, foldable, and rollable. For example, the flexible substrate may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The thin film transistor layer TFTL may be disposed on the substrate 101. Thin film transistors of each pixel PX, scan lines, data lines, power lines, scan control lines, and link lines connecting pads and data lines may be formed in the thin film transistor layer TFTL. Each of the thin film transistors may include a gate electrode, a semiconductor layer, a source electrode, and a drain electrode.

The thin film transistor layer TFTL may be disposed in the display area DA and the non-display area NDA. Specifically, the thin film transistors of each of the pixels PX, the scan lines, the data lines, and the power lines of the thin film transistor layer TFTL may be disposed in the display area DA. The scan control lines and the link lines of the thin film transistor layer TFTL may be disposed in the non-display area NDA.

The light-emitting element layer EML may be disposed on the thin film transistor layer TFTL. The light-emitting element layer EML may include the pixels PX which each may include a first electrode, a light-emitting layer, and a second electrode, and a pixel definition film which defines each of the pixels. The light-emitting layer may be an organic light-emitting layer including an organic material. The light-emitting layer may include a hole transporting layer, an organic light-emitting layer, and an electron transporting layer. When a predetermined or selected voltage is applied to the first electrode through the thin film transistor of the thin film transistor layer TFTL and a cathode voltage is applied to the second electrode, holes and electrons may move to the organic light-emitting layer through the hole transporting layer and the electron transporting layer, and may be combined with each other in the organic light-emitting layer to emit light. The pixels of the light-emitting element layer EML may be disposed in the display area DA. A schematic cross-sectional structure of each pixel will be described below with reference to FIG. 12.

The thin film encapsulation layer TFEL may be disposed on the light-emitting element layer EML. The thin film encapsulation layer TFEL may serve to prevent oxygen or moisture from permeating into the light-emitting element layer EML. To this end, the thin film encapsulation layer TFEL may include at least one inorganic film. The inorganic film may include a silicon nitride layer, a silicon oxynitride layer, a silicon oxide layer, a titanium oxide layer, or an aluminum oxide layer, but the disclosure is not limited thereto. In addition, the thin film encapsulation layer TFEL serves to protect the light-emitting element layer EML from foreign substances such as dust. To this end, the thin film encapsulation layer TFEL may include at least one organic film. The organic film may be made of acryl resin, epoxy resin, phenolic resin, polyamide resin, polyimide resin, or the like, but the disclosure is not limited thereto.

The thin film encapsulation layer TFEL may be disposed in both of the display area DA and the non-display area NDA. Specifically, the thin film encapsulation layer TFEL may be disposed to cover the light-emitting element layer EML of the display area DA and the non-display area NDA and to cover the thin film transistor layer TFTL of the non-display area NDA.

The touch sensing layer TSL may be disposed on the thin film encapsulation layer TFEL. Since the touch sensing layer TSL is disposed directly on the thin film encapsulation layer TFEL, a thickness of the display device 1 may be decreased as compared with a case in which a separate touch panel including the touch sensing layer TSL is attached onto the thin film encapsulation layer TFEL.

The touch sensing layer TSL may include touch electrodes for sensing a touch of a user using a capacitance method and routing lines connecting the pads and the touch electrodes. For example, the touch sensing layer TSL may sense the touch of the user using a self-capacitance method or a mutual capacitance method.

A cover window may be additionally disposed on the touch sensing layer TSL, and the touch sensing layer TSL and the cover window may be attached to each other by a transparent adhesive member. Meanwhile, the arrangement of the touch sensing layer TSL is not limited to that shown in FIG. 3, and the position thereof is not particularly limited as long as the touch sensing layer TSL is disposed between the light-emitting element layer EML and the cover window.

Hereinafter, the touch sensing layer TSL will be described in more detail.

Figure 4:
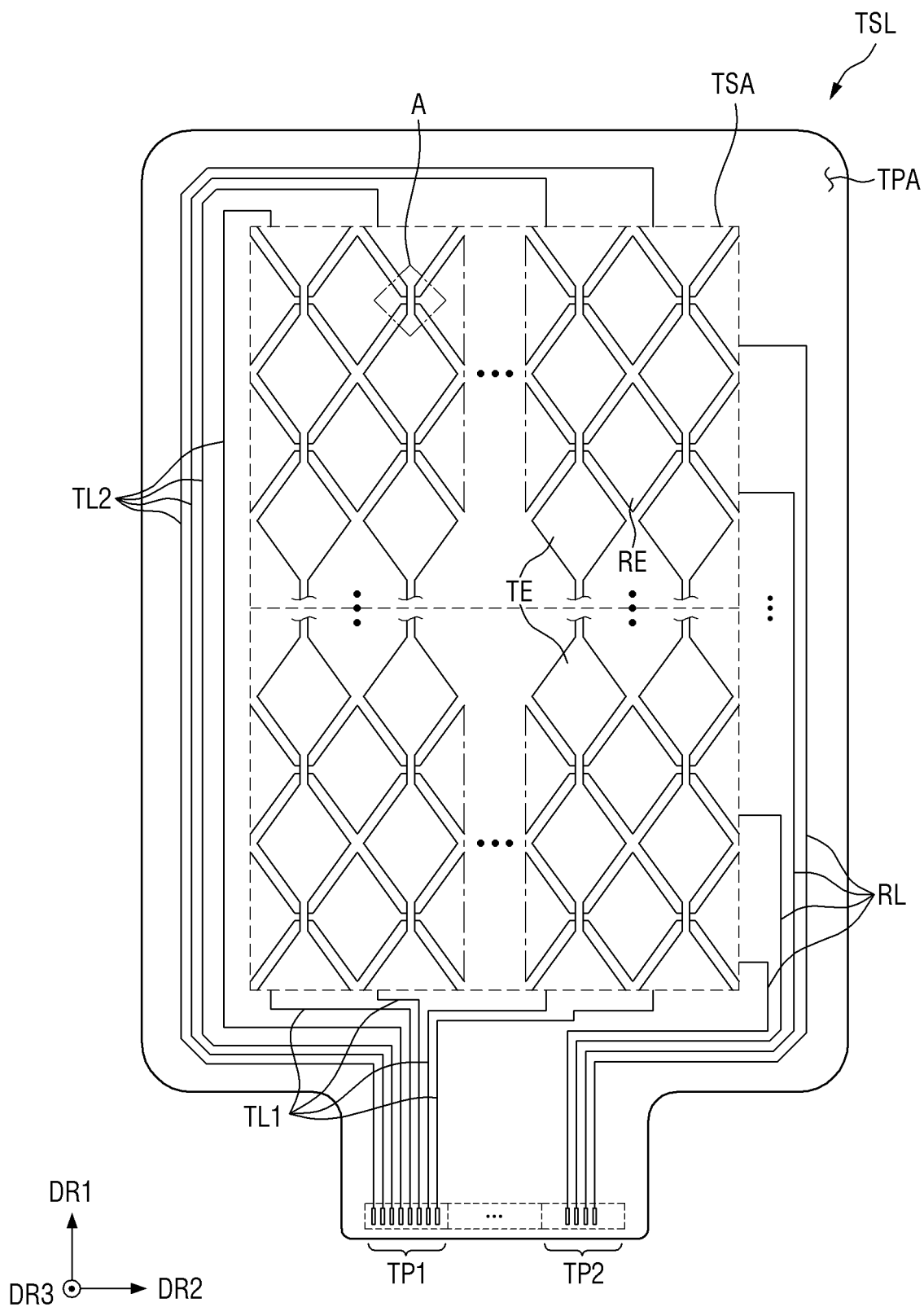
FIG. 4 is a plan view illustrating a touch sensing layer of FIG. 3.
Figure 5:
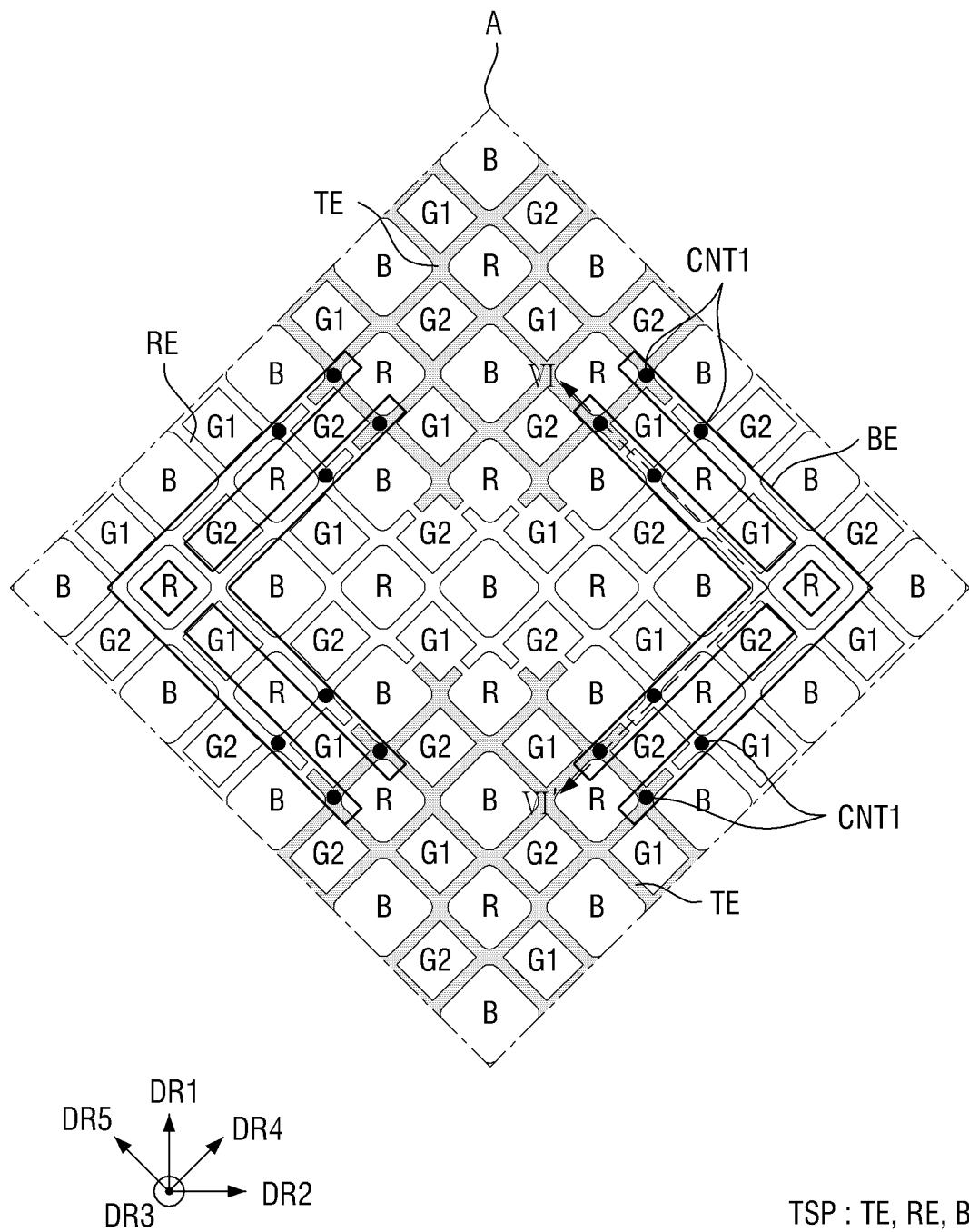
FIG. 5 is an enlarged view illustrating area A of FIG. 4.
Figure 6:
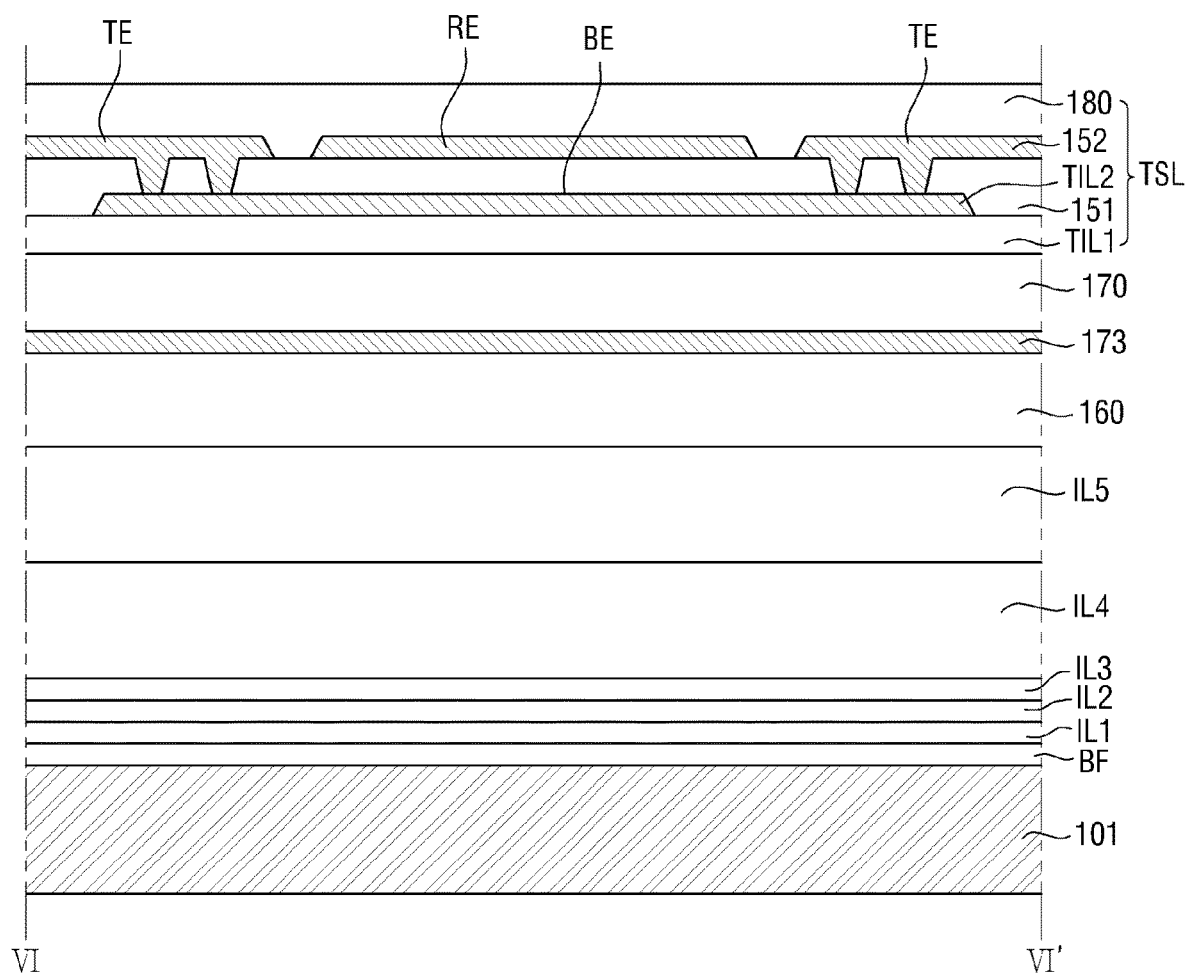
FIG. 6 is a schematic cross-sectional view taken along line VI-VI' of FIG. 5.

FIG. 4 is a plan view illustrating the touch sensing layer of FIG. 3. FIG. 5 is an enlarged view illustrating area A of FIG. 4. FIG. 6 is a schematic cross-sectional view taken along line VI-VI' of FIG. 5.

Referring to FIGS. 4 to 6, the touch sensing layer TSL includes a touch sensing area TSA for sensing a touch of a user and a touch peripheral area TPA disposed at a periphery of the touch sensing area TSA.

Touch electrode pads TP1 and TP2 and routing lines TL1, TL2, and RL may be disposed in the touch peripheral area TPA.

The touch electrode pads TP1 and TP2 may be disposed at a side of the display device 1. A touch circuit board may be attached onto the touch electrode pads TP1 and TP2 using, for example, an anisotropic conductive film. As a result, the touch electrode pads TP1 and TP2 may be electrically connected to the touch circuit board.

The routing lines TL1, TL2, and RL may include first routing lines TL1, second routing lines TL2, and third routing lines RL.

The first routing lines TL1 may be connected to one sides of first touch electrodes TE. In an embodiment, one ends of the first routing lines TL1 may be connected to the first touch electrodes TE disposed at a first portion of the touch sensing area TSA. Among four portions of the touch sensing area TSA, the first portion of the touch sensing area TSA may be a portion closer to a touch pad area in which the touch electrode pads TP1 and TP2 are disposed. The other ends of the first routing lines TL1 may be connected to some of the first touch electrode pads TP1 of the touch pad area. The first routing line TL1 may serve to connect the one sides of the first touch electrodes TE and the first touch electrode pads TP1.

The second routing lines TL2 may be connected to the other sides of the first touch electrodes TE. In an embodiment, one ends of the second routing lines TL2 may be connected to the first touch electrodes TE disposed at a second portion of the touch sensing area TSA. The second portion of the touch sensing area TSA may be a portion opposite to the first portion of the touch sensing area TSA. Among the four portions of the touch sensing areas TSA, the second portion of the touch sensing area TSA may be a portion positioned farther from the touch pad area in which the touch electrode pads TP1 and TP2 are disposed. The second routing lines TL2 may be connected to the first touch electrodes TE disposed at the second portion via the first portion and a fourth portion of the touch sensing area TSA. The other ends of the second routing lines TL2 may be connected to others of the first touch electrode pads TP1 of the touch pad area. The second routing line TL2 may serve to connect the other sides of the first touch electrodes TE and the first touch electrode pads TP1.

The third routing lines RL may be connected to one sides of second touch electrodes RE. One ends of the third routing lines RL may be connected to the second touch electrodes RE disposed at a third portion of the touch sensing area TSA. The third portion of the touch sensing area TSA may be a portion opposite to the fourth portion and may be a portion disposed between the first portion and the second portion in the second direction DR2. The other ends of the third routing lines RL may be connected to the second touch electrode pads TP2 of the touch pad area. The third routing line RL may serve to connect the second touch electrodes RE and the second touch electrode pads TP2.

Although not shown in the drawings, a ground line may be further disposed outside the routing lines TL1, TL2, and RL.

The ground line may be disposed at an outermost side of the touch sensing layer TSL. A ground voltage may be applied to the ground line. Accordingly, when static electricity is applied from the outside, the static electricity may be discharged to the ground line. One end of the ground line may be electrically connected to the touch electrode pads TP1 and TP2.

A guard line may be further disposed between the routing lines and the ground line. The guard line may serve to minimize coupling between the routing lines or minimize coupling between the routing lines and the ground line. The routing lines may be electrically connected to the touch electrode pads TP1 and TP2.

The touch sensing area TSA may overlap the display area DA. The touch electrodes TSP may be disposed in the touch sensing area TSA. The touch electrodes TSP may be disposed to overlap a pixel definition film 160 that defines each pixel PX. Each pixel PX may include subpixels R, G1, G2, and B. The touch electrodes TSP may be disposed to overlap the pixel definition film 160 that defines each of the subpixels R, G1, G2, and B. Such structure and configuration of the touch electrodes TSP may prevent a reduction in aperture area of the subpixels R, G1, G2, and B.

The subpixels R, G1, G2, and B may include first subpixels R that emits a first color, second subpixels G1 and G2 that emit a second color, and third subpixels B that emit a third color. The second subpixels G1 and G2 may include second-A subpixels G1 and second-B subpixels G2. One first subpixel R, two second subpixels (i.e., one second-A subpixel G1 and one second-B subpixel G2), and one third subpixel B may be defined as (or constitute) one pixel PX.

For example, as shown in FIG. 5, the first subpixels R and the third subpixels B may be alternately disposed in a first column in a first direction DR1, and the second-A subpixels G1 and the second-B subpixels G2 may be alternately disposed in a second column in the first direction DR1.

The subpixels R, G1, G2, and B may have different shapes and sizes. FIG. 5 illustrates that the third subpixel B has the largest size and the second subpixels G1 and G2 have the smallest size, but the sizes of the subpixels R, G1, G2, and B are not limited thereto. A schematic cross-sectional structure of each of the subpixels R, G1, G2, and B will be described in detail below with reference to FIG. 12.

The touch electrodes TSP may include the first touch electrodes TE, the second touch electrodes RE, and connection electrodes BE.

The first touch electrodes TE and the second touch electrodes RE may be disposed to be spaced apart from each other. The first touch electrodes TE may be disposed in columns in the first direction DR1, and the second touch electrodes RE may be disposed in rows in the second direction DR2. The first touch electrodes TE disposed in each of the columns in the first direction DR1 may be electrically connected. The second touch electrodes RE disposed in each of the rows in the second direction DR2 may be electrically connected.

The first touch electrodes TE and the second touch electrodes RE may have a diamond or triangular shape in a plan view. In an embodiment, the first touch electrodes TE and the second touch electrodes RE disposed at edges of the touch sensing area TSA may have a triangular shape in a plan view, and other first touch electrodes TE and second touch electrodes RE may have a diamond shape in a plan view.

As shown in FIG. 5, the first touch electrodes TE and the second touch electrodes RE may be formed as mesh-shaped electrodes. When the touch sensing layer TSL including the first touch electrodes TE and the second touch electrodes RE is formed on (or directly on) the thin film encapsulation layer TFEL, a distance between the second electrode of the light-emitting element layer EML and the first touch electrodes TE or the second touch electrodes RE of the touch sensing layer TSL may be small. Thus, high parasitic capacitance may be formed between the second electrode of the light-emitting element layer EML and the first touch electrodes TE or the second touch electrodes RE of the touch sensing layer TSL. In order to reduce the parasitic capacitance, the first touch electrodes TE and the second touch electrodes RE may be formed as the mesh-shaped electrodes as shown in FIG. 5 rather than unpatterned electrodes of a conductive layer made of a transparent oxide such as indium tin oxide (ITO) or indium zinc oxide (IZO).

The first touch electrodes TE and the second touch electrodes RE may be disposed to be spaced apart from each other, and the first touch electrodes TE adjacent to each other in the first direction DR1 may be electrically connected to each other through the connection electrodes BE. The first touch electrodes TE and the second touch electrodes RE may be disposed to be coplanar, and the connection electrodes BE may be disposed to not be coplanar with the first touch electrodes TE and the second touch electrodes RE. For example, as shown in FIG. 6, the first touch electrodes TE and the second touch electrodes RE may be formed of a second touch conductive layer 152, and the connection electrodes BE may be formed of a first touch conductive layer 151. A second touch insulating layer TIL2 may be disposed between the first touch conductive layer 151 and the second touch conductive layer 152. The first touch electrodes TE may be electrically connected to the connection electrodes BE through a first contact hole CNT1 passing through the second touch insulating layer TIL2 and exposing ends of the connection electrodes BE.

In an embodiment, the touch electrodes TSP, which may be the first touch electrodes TE, the second touch electrodes RE, or the connection electrodes BE, may be disposed to overlap a gap G between protrusion patterns PP1 and PP2 to be described below. The touch electrodes TSP may block the gap G formed in the display area DA, thereby preventing a phenomenon such as reflection of external light from the gaps G and/or visibility of a spot. This will be described in detail below.

Hereinafter, the signal wires DL, the connection wires DM, and fan-out wires F for transmitting driving signals will be described in detail.

Figure 7:
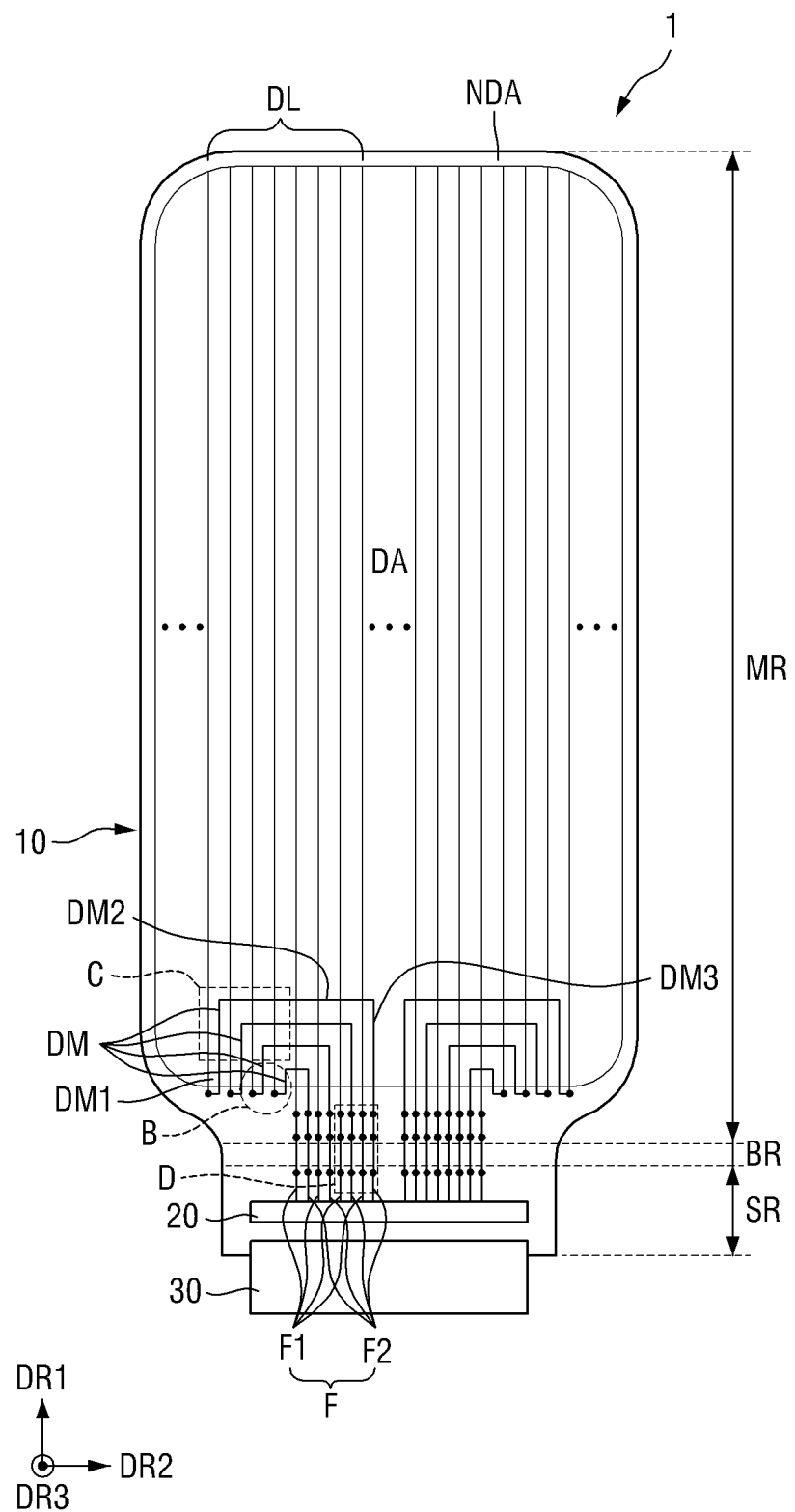
FIG. 7 is a plan view illustrating signal wires, connection wires, and fan-out wires of a display device according to an embodiment.
Figure 8:
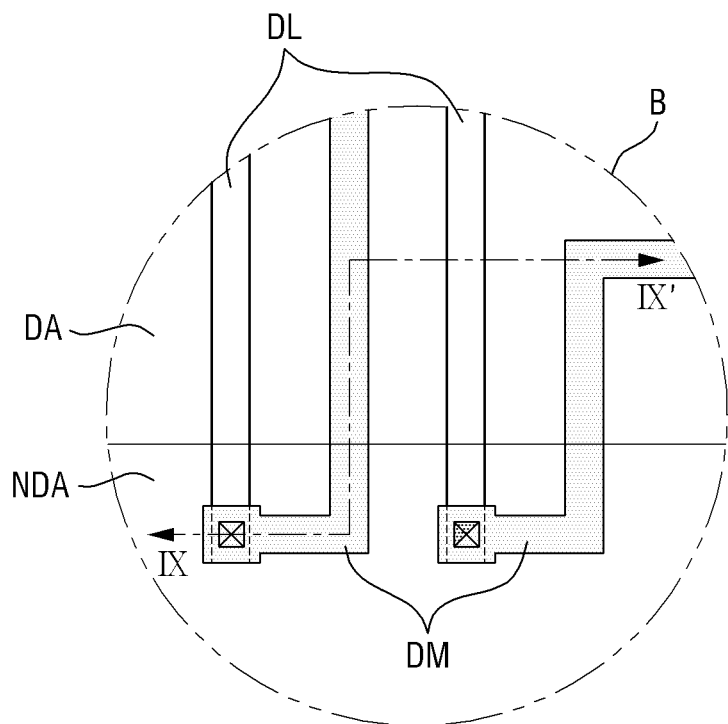
FIG. 8 is an enlarged view illustrating area B of FIG. 7.
Figure 9:
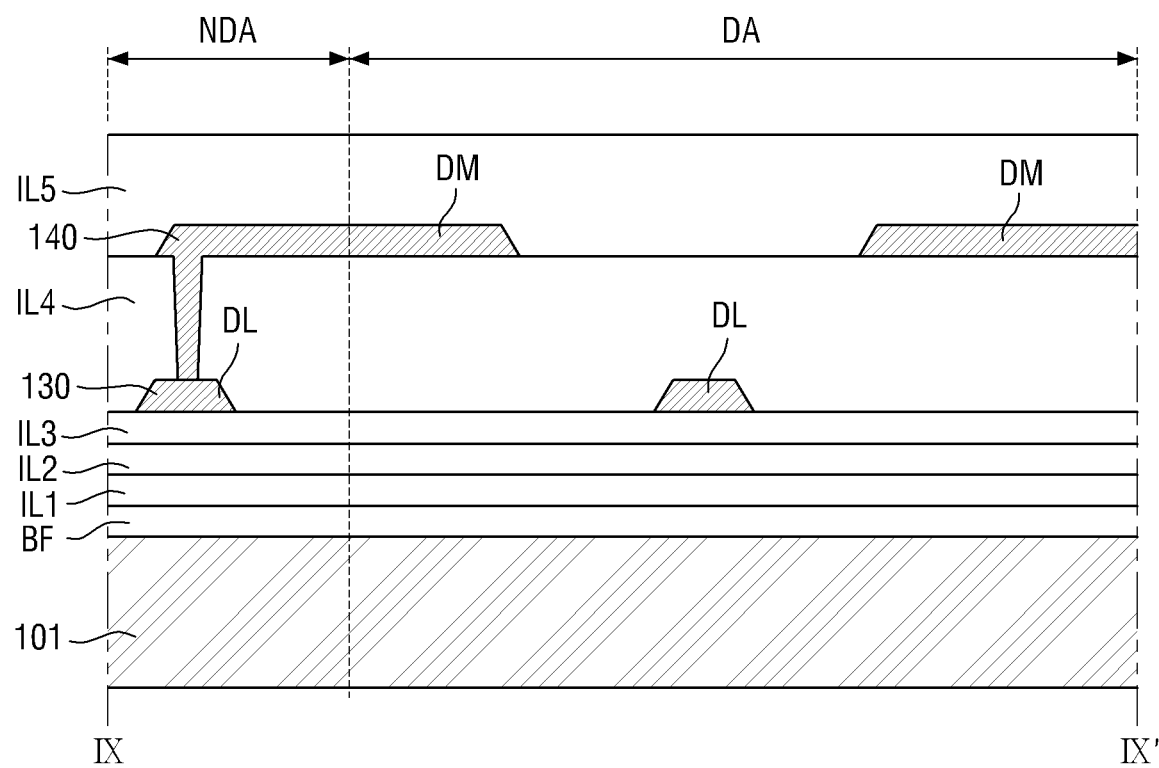
FIG. 9 is a schematic cross-sectional view taken along line IX-IX' of FIG. 8.
Figure 10:
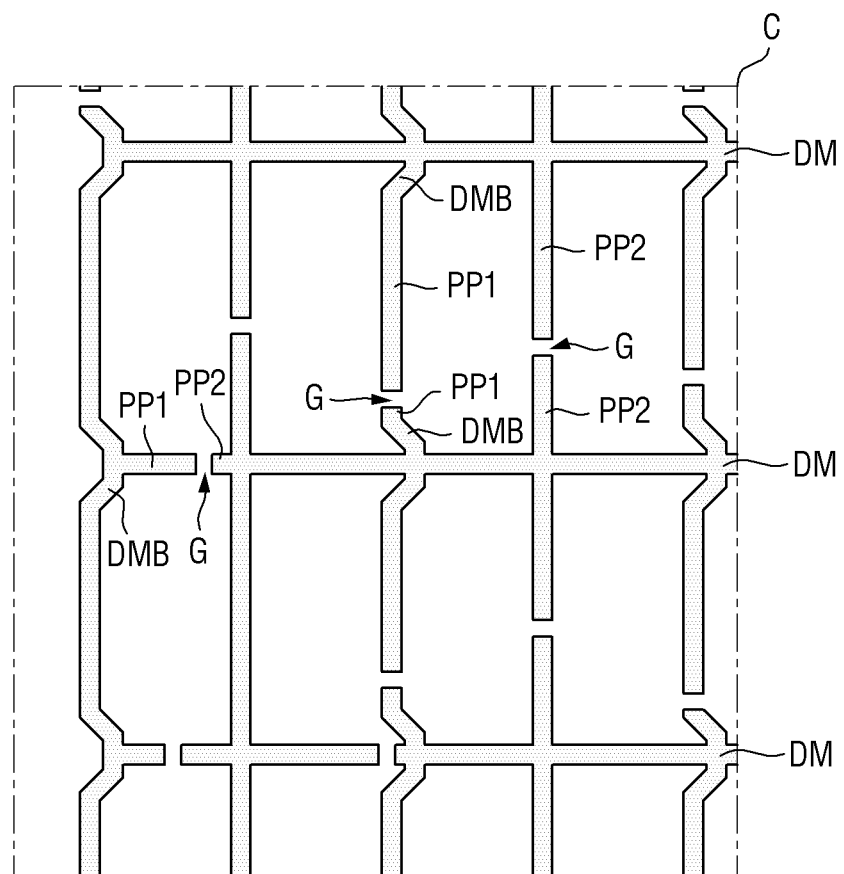
FIG. 10 is an enlarged view illustrating area C of FIG. 7.
Figure 10:
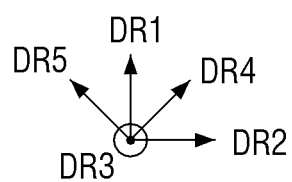
Figure 11:
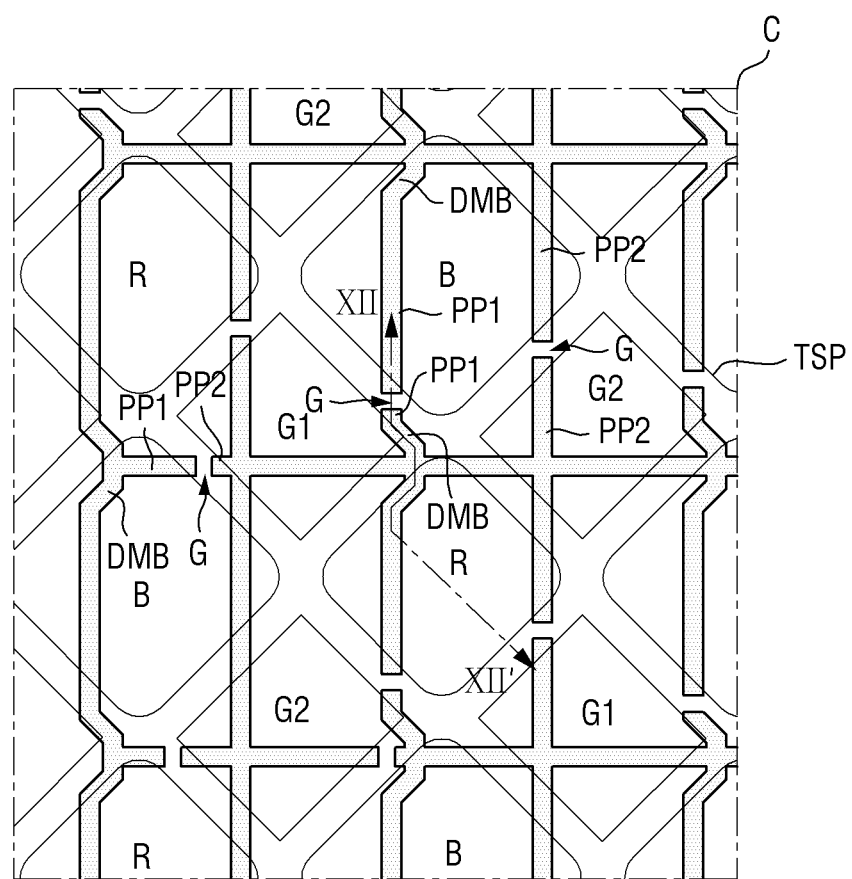
FIG. 11 is an enlarged view illustrating area C of FIG. 7 in which a touch sensing layer is applied.
Figure 12:
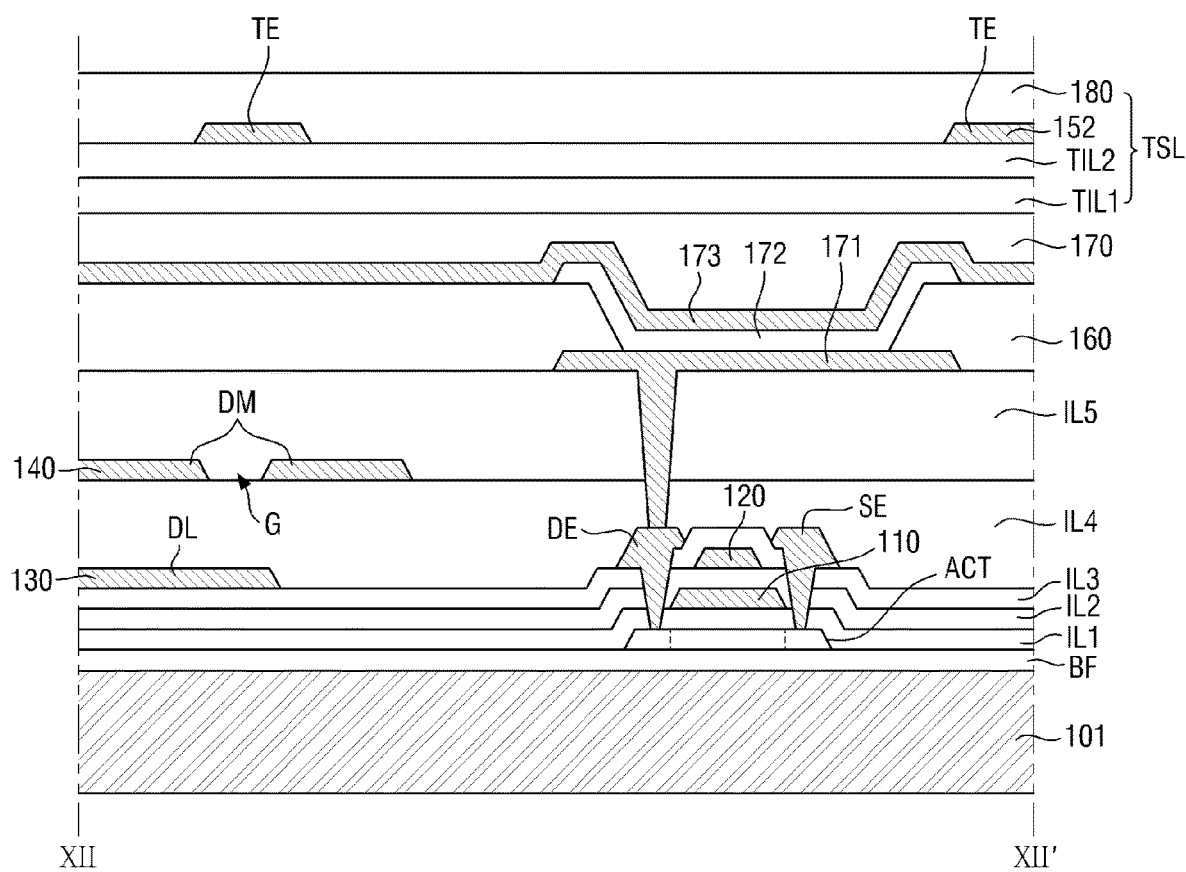
FIG. 12 is a schematic cross-sectional view taken along line XII-XII' of FIG. 11.

FIG. 7 is a plan view illustrating the signal wires DL, the connection wires DM, and the fan-out wires F of the display device 1 according to an embodiment. FIG. 8 is an enlarged view illustrating area B of FIG. 7. FIG. 9 is a schematic cross-sectional view taken along line IX-IX' of FIG. 8. FIG. 10 is an enlarged view illustrating area C of FIG. 7. FIG. 11 is an enlarged view illustrating area C of FIG. 7 in which a touch sensing layer TSL is applied. FIG. 12 is a schematic cross-sectional view taken along line XII-XII' of FIG. 11.

Figure 13:
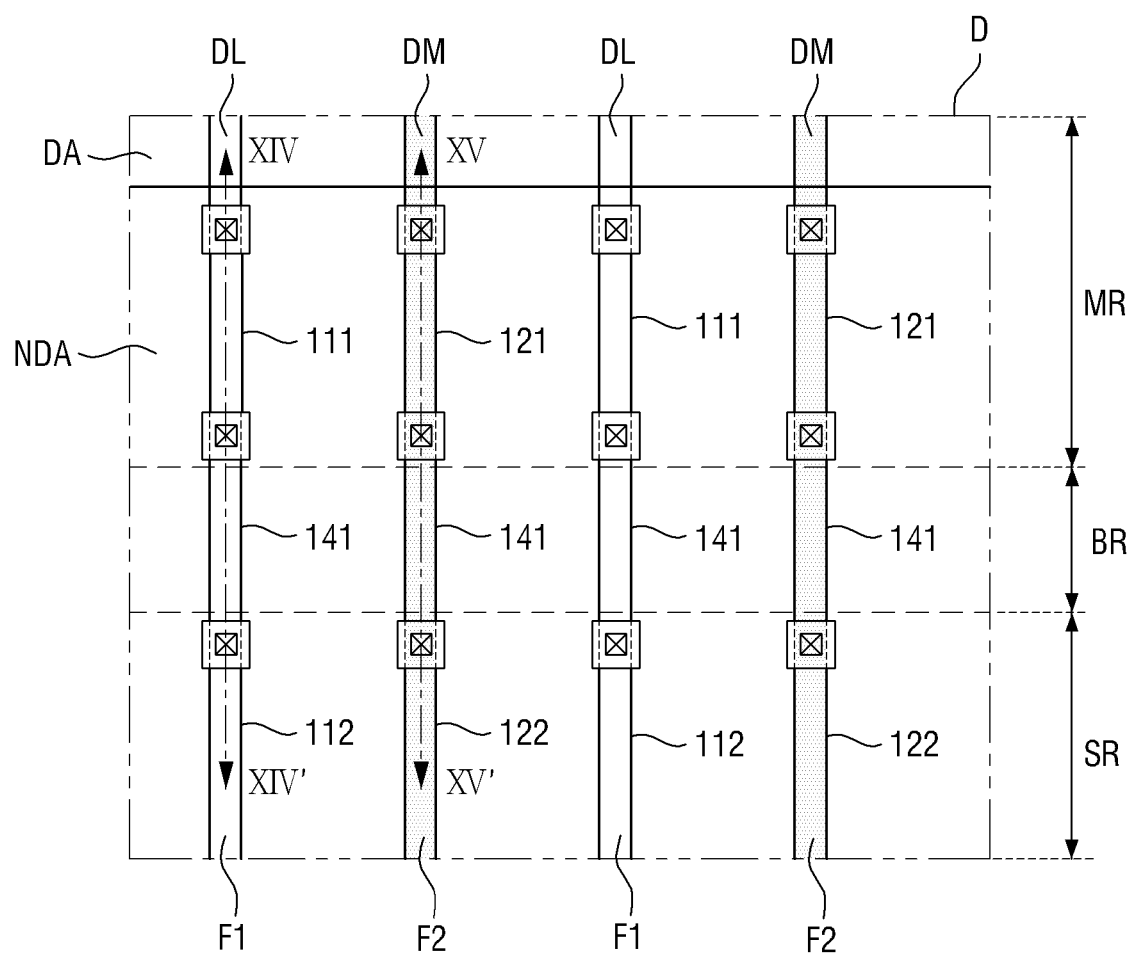
FIG. 13 is an enlarged view illustrating area D of FIG. 7.
Figure 14:
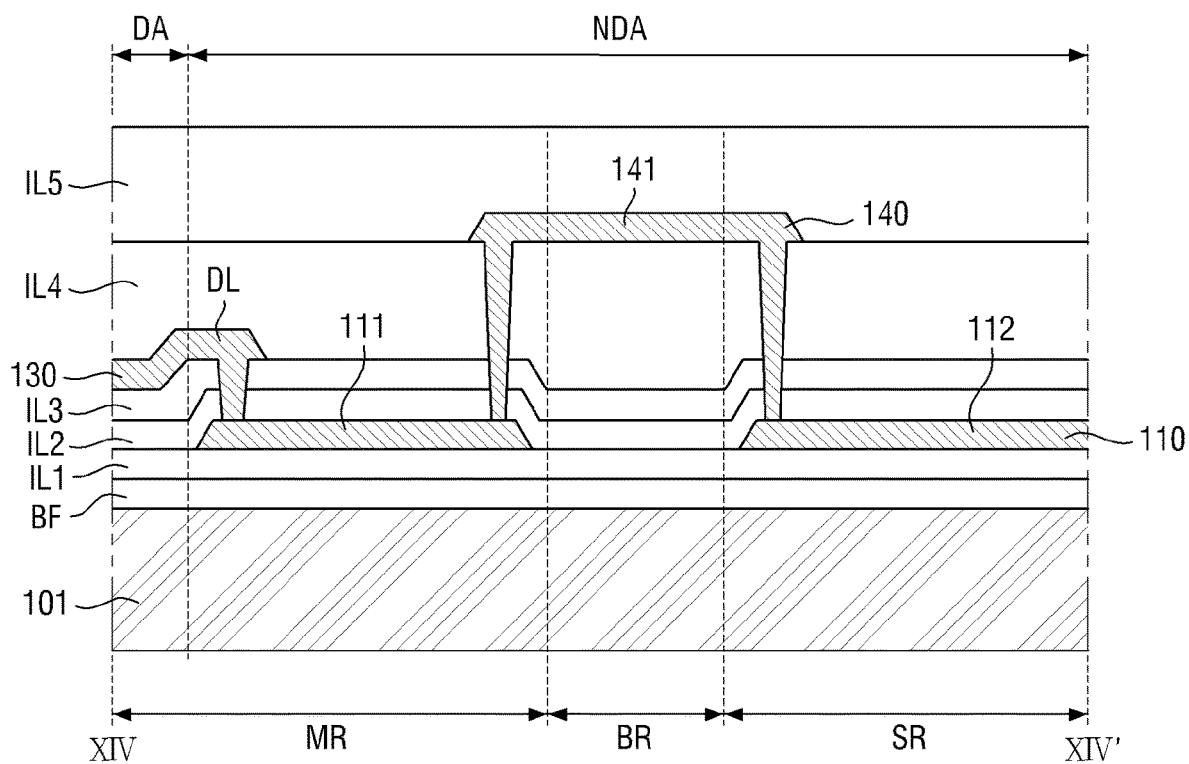
FIG. 14 is a schematic cross-sectional view taken along line XIV-XIV' of FIG. 13.
Figure 15:
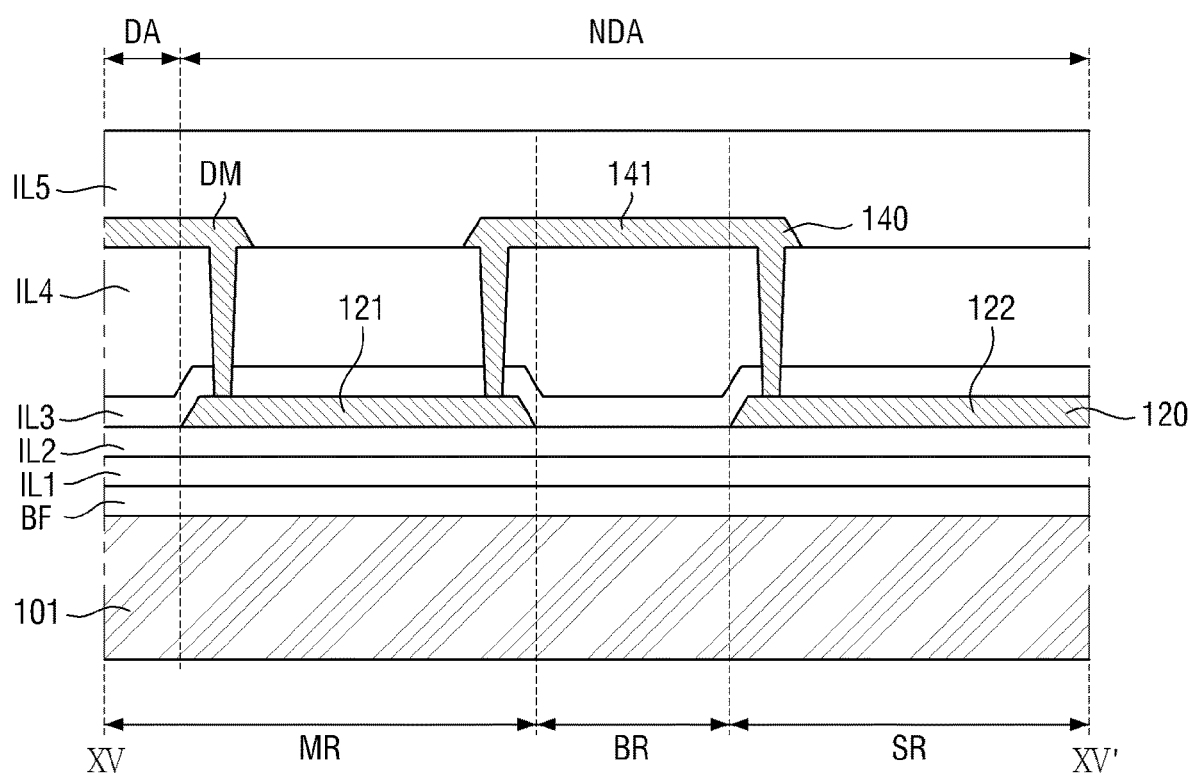
FIG. 15 is a schematic cross-sectional view taken along line XV-XV' of FIG. 13.

FIG. 13 is an enlarged view illustrating area D of FIG. 7. FIG. 14 is a schematic cross-sectional view taken along line XIV-XIV' of FIG. 13. FIG. 15 is a schematic cross-sectional view taken along line XV-XV' of FIG. 13.

Referring to FIGS. 7 to 15, the display device 1 may include the signal wires DL, the connection wires DM, and the fan-out wires F.

The signal wires DL, the connection wires DM, and the fan-out wires F may be formed to extend in the first direction DR1 or the second direction DR2 and disposed to be substantially symmetrical with respect to a reference axis (not shown) passing through a center area of the display device 1. Hereinafter, the signal wires DL, the connection wires DM, and the fan-out wires F disposed at a left side of the display device 1 will be described.

The signal wires DL may extend from the non-display area NDA of the main area MR and may be disposed in the display area DA. The signal wires DL may extend in the first direction DR1 and may be disposed (or sequentially disposed) at an interval in the second direction DR2. The second direction DR2 may be a direction intersecting the first direction DR1 and may be perpendicular to the first direction DR1.

The signal wires DL (or their ends) may be electrically connected to the connection wires DM. The signal wires DL electrically connected to the connection wires DM may be disposed in the non-display area NDA at a lower portion of the main area MR. The signal wires DL may be, for example, data lines for transmitting data signals to the pixels PX.

The connection wires DM may extend from the non-display area NDA of the main area MR to the non-display area NDA of the sub-area SR via the display area DA. The connection wires DM may be electrically connected to the signal wires DL in the non-display area NDA of the main area MR.

The connection wires DM may be disposed to not be coplanar with a layer in which the signal wires DL are disposed. The connection wires DM may be insulated from the signal wires DL through an insulating layer. For example, as shown in FIGS. 8 and 9, the signal wires DL may be implemented with a third conductive layer 130, the connection wires DM may be implemented with a fourth conductive layer 140, and the signal wires DL and the connection wires DM may be insulated from each other by a fourth insulating layer IL4. The third conductive layer 130 may include the signal wires DL, and the fourth conductive layer may include the connection wires DM. The connection wires DM may be electrically connected to the signal wires DL through a contact hole passing through the fourth insulating layer IL4 and exposing ends of the signal wires DL.

Each of the connection wires DM may include a first portion DM1 extending from the non-display area NDA in the first direction DR1, a second portion DM2 extending from one end of the first portion DM1 in the second direction DR2, and a third portion DM3 extending from one end of the second portion DM2 in a direction opposite to the first direction DR1. The first portion DM1 of each connection wire DM may be electrically connected to a corresponding one of the signal wires DL, and the third portion DM3 thereof may be electrically connected to a corresponding one of the fan-out wires F. Accordingly, each connection wire DM may receive a driving signal from the driving chip 20 through the third portion DM3 and may provide the driving signal to the pixel PX through the first portion DM1. The first portion DM1 and the third portion DM3 may be disposed to be spaced apart from each other, and the second portion DM2 may be disposed between the first portion DM1 and the third portion DM3.

As described above, the display device 1 may include the connection wires DM disposed via the display area DA, and an image signal may be provided to the signal wires DL through the connection wires DM. Therefore, an additional dead space which otherwise would be required for connecting the signal wire DL directly to the fan-out wire F may be unnecessary. As a result, a dead space may be reduced or minimized.

The connection wires DM may be partially bent and include a diagonal portion DMB extending in a diagonal direction. The diagonal portion DMB may be a portion in which a connection wire DM is bent in a first diagonal direction DR4 or a second diagonal direction DR5. Here, the first diagonal direction DR4 may refer to a diagonal direction between the first direction DR1 and the second direction DR2, and the second diagonal direction DR5 may refer to a diagonal direction between the first direction DR1 and a direction opposite to the second direction DR2.

As shown in FIG. 10, the diagonal portion DMB may have a shape that is bent in the first diagonal direction DR4 and/or the second diagonal direction DR5 from an end of a connection wire DM which extends in the first direction DR1.

The diagonal portion DMB may have a shape protruding from a side of the connection wire DM. For example, as shown in FIG. 10, the diagonal portion DMB may protrude in a direction opposite to the first diagonal direction DR4 from a side of the connection wire DM. The diagonal portion DMB may protrude in the second diagonal direction DR5 from a side of the connection wire DM.

The connection wires DM may include the protrusion patterns PP1 and PP2 protruding from a side of the respective connection wires DM. The protrusion patterns PP1 and PP2 may include first protrusion patterns PP1 each protruding from the diagonal portion DMB of the respective connection wires DM and second protrusion patterns PP2 each protruding from an extension portion of the respective connection wires DM. The extension portion may include portions of a connection wire DM excluding the diagonal portion DMB. For example, the extension portion of a connection wire DM may be any portion of the connection wire DM excluding the diagonal portion DMB.

The first protrusion patterns PP1 each may have a shape protruding from a side of the diagonal portion DMB. The first protrusion patterns PP1 may protrude in the first direction DR1, in a direction opposite to the first direction DR1, in the second direction DR2, and/or in a direction opposite to the second direction DR2.

Adjacent ones of the first protrusion patterns PP1 may face each other. The first protrusion patterns PP1 may include parts (or end parts) that may overlap the touch electrodes TSP. Adjacent ones of the parts of the first protrusion patterns PP1 may face each other.

A gap G may be defined between the parts of the first protrusion patterns PP1. For example, the gap G may be between the adjacent parts of the first protrusion patters PP1 which face each other. The gaps G between the parts of the first protrusion patterns PP1 may overlap the touch electrodes TSP. The gaps G may overlap the first touch electrodes TE, the second touch electrodes RE, or the connection electrodes BE.

A width of the gaps G between the parts (or end parts) of the first protrusion patterns PP1 may be smaller than a line width of the touch electrodes TSP. In addition, the width of the gaps G may be smaller than a line width of the connection wires DM. The width of the gaps G may be a distance between the parts (or end parts) of the first protrusion patterns PP1 which face each other.

The width of the gaps G may be in a range of about 2.0 µm to about 3.0 µm. The line width of the touch electrodes TSP may be in a range of about 3.2 µm to about 4.8 µm. However, the disclosure is not limited thereto. In other embodiments, for example, the line width of the touch electrodes TSP may be in a range of about 4.8 µm to about 7.2 µm. An area in which the touch electrodes TSP overlap the gaps G may be increased, and thus, it is possible to more effectively prevent a phenomenon such as reflection of external light from the gaps G and/or visibility a spot. The line width of the connection wires DM may be in a range of about 2.4 µm to about 3.6 µm. However, the width of the gaps G and the line width of the wires are not limited thereto. For example, as long as the gaps G overlap the touch electrodes TSP, the line width of the wires may be in any range.

Since the gaps G between the first protrusion patterns PP1 overlap the touch electrodes TSP, the gaps G formed in the display area DA may be blocked by the touch electrodes TSP, thereby preventing a phenomenon such as reflection of external light from the gaps G and/or visibility of a spot. The second protrusion patterns PP2 may have a shape protruding from the extension portions of the connection wires DM excluding the diagonal portion DMB. The second protrusion patterns PP2 may protrude in the first direction DR1, in the direction opposite to the first direction DR1, in the second direction DR2, and/or in the direction opposite to the second direction DR2.

Adjacent ones of the second protrusion patterns PP2 may face each other. The second protrusion patterns PP2 may include parts (or end parts) that may overlap the touch electrodes TSP. Adjacent ones of the parts of the second protrusion patterns PP2 may face each other.

A gap G may be defined between the parts of the second protrusion patterns PP2 which face each other. The gaps G between the parts of the second protrusion patterns PP2 may overlap the touch electrodes TSP. The gaps G may overlap the first touch electrodes TE, the second touch electrodes RE, or the connection electrodes BE.

A width of the gaps G between parts (or end parts) of the second protrusion patterns PP2 may be smaller than the line width of the touch electrodes TSP. In addition, the width of the gaps G may be smaller than the line width of the connection wires DM. The width of the gaps G may be a distance between the parts (or end parts) of the second protrusion patterns PP2, which face each other.

The width of the gaps G may be in a range of about 2.0 µm to about 3.0 µm. The line width of the touch electrodes TSP may be in a range of about 3.2 µm to about 4.8 µm. However, the disclosure is not limited thereto. In other embodiments, for example, the line width of the touch electrodes TSP may be in a range of about 4.8 µm to about 7.2 µm. An area in which the touch electrodes TSP overlap the gaps G may be increased, and it is possible to more effectively prevent a phenomenon such as reflection of external light from the gaps G and/or visibility of a spot. The line width of the connection wires DM may be in a range of about 2.4 µm to about 3.6 µm. However, the width of the gaps G and the line width of the wires are not limited thereto. For example, as long as the gaps G between the second protrusion patterns PP2 overlap the touch electrodes TSP, the line width of the wires may be in any range.

Since the gaps G between the second protrusion patterns PP2 overlap the touch electrodes TSP, the gaps G formed in the display area DA may be blocked by the touch electrodes TSP, thereby preventing a phenomenon such as reflection of external light from the gaps G and/or visibility of a spot.

A part (or end part) of at least one of the first protrusion patterns PP1 and a part (or end part) of at least one of the second protrusion patterns PP2 may be adjacent and face each other, and may overlap the touch electrodes TSP.

A gap G may be defined between the part of the at least one of the first protrusion patterns PP1 and the part of the at least one of the second protrusion patterns PP2 which face each other. The gap G may overlap each of the touch electrodes TSP. The gaps G between parts of the first protrusion patterns PP1 and the parts of the second protrusion patterns PP2 may overlap the first touch electrodes TE, the second touch electrodes RE, or the connection electrodes BE. The gaps G formed in the display area DA may be blocked by the touch electrodes TSP, thereby preventing a phenomenon such as reflection of external light from the gaps G and/or visibility of a spot.

The first protrusion patterns PP1 and the second protrusion patterns PP2 may be alternately disposed in the second direction DR2. The first protrusion patterns PP1 may be disposed between the second protrusion patterns PP2.

The first protrusion patterns PP1 and/or the second protrusion patterns PP2 may be disposed at an interval in the first direction DR1. For example, an interval between the first protrusion patterns PP1 or the second protrusion patterns PP2 disposed in the first direction DR1 may be substantially the same as an interval between the connection wires DM disposed in the first direction DR1.

The first protrusion patterns PP1 and/or the second protrusion patterns PP2 may be disposed at an interval in the second direction DR2. For example, an interval between the first protrusion patterns PP1 or the second protrusion patterns PP2 disposed in the second direction DR1 may be substantially the same as an interval between the connection wires DM disposed in the second direction DR2.

The first protrusion patterns PP1 each may be disposed at a side of each of the second subpixels G1 and G2, and the second protrusion patterns PP2 each may be disposed at another side of each of the second subpixels G1 and G2.

When the protrusion patterns PP1 and PP2 extend in the first direction DR1, a length of the first protrusion patterns PP1 in the first direction DR1 may be different from a length of the second protrusion patterns PP2 in the first direction DR1.

When the protrusion patterns PP1 and PP2 extend in the second direction DR2, a length of the first protrusion patterns PP1 in the second direction DR2 may be different from a length of the second protrusion patterns PP2 in the second direction DR2.

FIG. 12 illustrates an embodiment where the gaps G between the protrusion patterns PP1 and PP2 overlap the first touch electrodes TE, but the embodiments are not limited thereto. In other embodiments, the gaps G between the protrusion patterns PP1 and PP2 may overlap the first touch electrodes TE or the connection electrodes BE.

The fan-out wires F may extend from the driving chip 20 of the sub-area SR to the non-display area NDA of the main area MR.

The fan-out wires F may be electrically connected to the signal wires DL or the connection wires DM. Some of the fan-out wires F may be directly connected to some of the signal wires DL, and the rest of the fan-out wires F may be directly connected to the connection wires DM and connected to the signal wires DL using the connection wires DM.

The fan-out wires F may include first fan-out wires F1 and second fan-out wires F2. FIG. 7 illustrates an embodiment where the first fan-out wires F1 are directly connected to the signal wire DL and the second fan-out wires F2 are directly connected to the connection wire DM, but the embodiment are not limited thereto. In other embodiments, the first fan-out wires F1 may be directly connected to the connection wire DM, and the second fan-out wires F2 may be directly connected to the signal wire DL.

As shown in FIG. 13, each of the fan-out wires F may include a main fan-out wire 111 or 121, a bending fan-out wire 141, and a sub-fan-out wire 112 or 122.

The main fan-out wires 111 and 121 and the sub-fan-out wires 112 and 122 may be spaced apart from each other, and the bending fan-out wires 141 may serve to connect the main fan-out wires 111 and 121 and the sub-fan-out wires 112 and 122.

The main fan-out wires 111 and 121 may be disposed in the non-display area NDA of the main area MR. One end of the main fan-out wire 111 or 121 may be connected to a corresponding one of the connection wires DM or the signal wires DL. Another end of the main fan-out wire 111 or 121 may be connected to the bending fan-out wire 141.

The main fan-out wires 111 and 121 may be connected (or directly connected) to the connection wires DM or the signal wires DL at a side of the non-display area NDA of the main area MR.

The main fan-out wires 111 and 121 may be disposed to not be coplanar with a layer in which the connection wires DM or the signal wires DL are disposed. The main fan-out wires 111 and 121 may be insulated from the connection wires DM or the signal wires DL by an insulating layer. Some of the main fan-out wires 111 and 121 may be disposed to not be coplanar and may be insulated from each other by an insulating layer.

For example, as shown in FIGS. 13 and 14, first main fan-out wires 111 of the first fan-out wires F1 may be connected (or directly connected) to the signal wires DL. The first main fan-out wires 111 may be implemented with a first conductive layer 110, and the signal wires DL may be implemented with the third conductive layer 130. The first conductive layer 110 may include the first main fan-out wires 111. The first main fan-out wires 111 may be insulated from the signal wires DL by a second insulating layer IL2 and a third insulating layer IL3. The signal wires DL may be connected (or directly connected) to the first main fan-out wires 111, respectively, through a contact hole passing through the second insulating layer IL2 and the third insulating layer IL3 and exposing ends of the first main fan-out wires 111.

As shown in FIGS. 13 and 15, second main fan-out wires 121 of the second fan-out wires F2 may be connected (or directly connected) to the connection wires DM. The second main fan-out wires 121 may be disposed not to be coplanar with a layer in which the first main fan-out wires 111 are disposed. The second main fan-out wires 121 may be implemented with a second conductive layer 120, the connection wires DM may be implemented with the fourth conductive layer 140. The second conductive layer 120 may include the second main fan-out wires 121. The second main fan-out wires 121 and the connection wires DM may be insulated from each other by the third insulating layer IL3 and the fourth insulating layer IL4. The connection wires DM may be connected (or directly connected) to the second main fan-out wires 121, respectively, through a contact hole passing through the third insulating layer IL3 and the fourth insulating layer IL4 and exposing ends of the second main fan-out wires 121.

The sub-fan-out wires 112 and 122 may be disposed in the sub-area SR.

The sub-fan-out wires 112 and 122 may extend in the first direction DR1 and may be disposed (or sequentially disposed) at an interval in the second direction DR2. The sub-fan-out wires 112 and 122 may be spaced apart from each other. The sub-fan-out wires 112 and 122 may not overlap each other in the thickness direction.

The sub-fan-out wires 112 and 122 may be spaced apart from the main fan-out wires 111 and 121. The sub-fan-out wires 112 and 122 may be electrically connected to the main fan-out wires 111 and 121 by the bending fan-out wires 141. Ends of the sub-fan-out wires 112 and 122 may be connected to output terminals of the driving chip 20, and other ends of the sub-fan-out wires 112 and 122 may be connected to bending connection wires 410. The sub-fan-out wires 112 and 122 may be disposed to be coplanar with a layer in which the main fan-out wires 111 and 121 are disposed.

For example, as shown in FIGS. 13 and 14, an end of a first sub-fan wire 112 of the first fan-out wire F1 may be connected to a corresponding bending fan-out wire 141. The first sub-fan-out wires 112 may be electrically connected to the first main fan-out wires 111 by the bending fan-out wires 141. The first sub-fan-out wires 112 may be disposed to be coplanar with the first main fan-out wires 111. The first sub-fan-out wires 112 may be implemented with the first conductive layer 110. The first conductive layer 110 may include the first sub-fan-out wires 112.

As shown in FIGS. 13 and 15, an end of a second sub-fan-out wire 122 of the second fan-out wire F2 may be connected to a corresponding bending fan-out wire 141. The second sub-fan-out wires 122 may be electrically connected to the second main fan-out wires 121 by the bending fan-out wires 141. The second sub-fan-out wires 122 may be disposed to be coplanar with the second main fan-out wires 121. The second sub-fan-out wires 122 may be implemented with the second conductive layer 120. The second conductive layer 120 may include the second sub-fan-out wires 122.

The bending fan-out wires 141 may be disposed in the bent area BR. The bending fan-out wires 141 may extend in the first direction DR1 and may be disposed (or sequentially disposed) at an interval in the second direction DR2.

Ends of the bending fan-out wires 141 may extend to the non-display area NDA of the main area MR and may be connected to the main fan-out wires 111 and 121. Other ends of the bending fan-out wires 141 may extend to the sub-area SR and may be connected to the sub-fan-out wires 112 and 122. The main fan-out wires 111 and 121 and the sub-fan-out wires 112 and 122 may be connected by the bending fan-out wires 141.

The bending fan-out wires 141 may be disposed to not be coplanar with the layer in which the main fan-out wires 111 and 121 and the sub-fan-out wires 112 and 122 are disposed. The bending fan-out wires 141 may be insulated from the main fan-out-wires 111 and 121 and the sub-fan-out wires 112 and 122 by an insulating layer. The bending fan-out wires 141 may be disposed to be coplanar with the connection wires DM. The bending fan-out wires 141 may be implemented with the fourth conductive layer 140. The fourth conductive layer 140 may include the bending fan-out wires 141.

For example, as shown in FIGS. 13 and 14, the bending fan-out wires 141 of the first fan-out wires F1 may connect the first main fan-out wires 111 and the first sub-fan-out wires 112. The bending fan-out wires 141 may be insulated from the first main fan-out wires 111 and the first sub-fan-out wires 112 by the second insulating layer IL2, the third insulating layer IL3, and the fourth insulating layer IL4. Ends of the bending fan-out wires 141 may be connected to the first main fan-out wires 111, respectively, through a contact hole passing through the second insulating layer IL2, the third insulating layer IL3, and the fourth insulating layer IL4 and exposing ends of the first main fan-out wires 111. Other ends of the bending fan-out wires 141 may be connected to the first sub-fan-out wires 112, respectively, through a contact hole passing through the second insulating layer IL2, the third insulating layer IL3, and the fourth insulating layer IL4 and exposing ends of the second sub-fan-out wires 122.

As shown in FIGS. 13 and 15, the bending fan-out wires 141 of the second fan-out wires F2 may connect the second main fan-out wires 121 and the second sub-fan-out wires 122. The bending fan-out wires 141 may be insulated from the second main fan-out wires 121 and the second sub-fan-out wires 122 by the third insulating layer IL3 and the fourth insulating layer IL4. Ends of the bending fan-out wire 141 may be connected to the second main fan-out wires 121, respectively, through a contact hole passing through the third insulating layer IL3 and the fourth insulating layer IL4 and exposing ends of the second main fan-out wire 121. Other ends of the bending fan-out wires 141 may be connected to the second sub-fan-out wires 122, respectively, through a contact hole passing through the third insulating layer IL3 and the fourth insulating layer IL4 and exposing ends of the second sub-fan-out wire 122.

The signal wires DL, the connection wires DM, and the fan-out wires F are not limited to the embodiments shown in FIGS. 7 to 15, and the conductive layers constituting or including the wires may be variously modified.

Referring to FIG. 12, the display device 1 may include the substrate 101, a buffer layer BF, a semiconductor layer ACT, a first insulating layer IL1 the first conductive layer 110, the second insulating layer IL2, the second conductive layer 120, the third insulating layer IL3, the third conductive layer 130, the fourth insulating layer IL4, the fourth conductive layer 140, a fifth insulating layer ILS, a first electrode layer 171, the pixel definition film 160 including an opening exposing the first electrode layer 171, a light-emitting layer 172 disposed in the opening of the pixel definition film 160, a second electrode layer 173 disposed on the light-emitting layer 172 and the pixel definition film 160, and a passivation layer 170.

Each of the above-described layers may be formed as a single film but may also be formed as a stacked film including a plurality of films. Other layers may be further disposed between the above-described layers.

The substrate 101 may support each of the layers disposed thereon. The substrate 101 may be made of an insulating material. The substrate 101 may be made of an inorganic material, such as glass or quartz, or an organic material such as polyimide. The substrate 101 may be a rigid substrate or a flexible substrate.

The buffer layer BF may be disposed on the substrate 101. The buffer layer BF may prevent diffusion of impurity ions, prevent permeation of moisture, and perform a surface planarization function. The buffer layer BF may include silicon nitride, silicon oxide, silicon oxynitride, or the like.

The semiconductor layer ACT may be disposed on the buffer layer BF. The semiconductor layer ACT constitutes channels of transistors of the pixels PX. The semiconductor layer ACT may include polycrystalline silicon. Polycrystalline silicon may be formed by crystallizing amorphous silicon.

When the semiconductor layer ACT is made of polycrystalline silicon and is doped with ions, the ion-doped semiconductor layer ACT may have conductivity. As a result, the semiconductor layer ACT may include not only channel areas of the transistors but also source areas and drain areas. A source area and a drain area may be connected to sides of each channel area.

In another embodiment, the semiconductor layer ACT may include single crystalline silicon, low temperature polycrystalline silicon, amorphous silicon, or an oxide semiconductor. For example, the oxide semiconductor may include a binary compound ($AB_x$), a ternary compound ($AB_xC_y$), or a quaternary compound ($AB_xC_yD_z$), which includes indium, zinc, gallium, tin, titanium, aluminum, hafnium (Hf), zirconium (Zr), magnesium (Mg), or the like. In an embodiment, the semiconductor layer ACT may include ITZO (an oxide including indium, tin, and titanium) or IGZO (an oxide including indium, gallium, and tin).

The first insulating layer IL1 may be disposed on the semiconductor layer ACT. The first insulating layer IL1 may be disposed on a surface (or substantially entire surface) of the substrate 101. The first insulating layer IL1 may be a gate insulating film having a gate insulating function. The first insulating layer IL1 may include a silicon compound, a metal oxide, or the like. For example, the first insulating layer IL1 may include silicon oxide, silicon nitride, silicon oxynitride, aluminum oxide, tantalum oxide, hafnium oxide, zirconium oxide, titanium oxide, or the like. The first insulating layer IL1 may be a single film or a multilayer film including stacked films made of different materials.

The first conductive layer 110 may be disposed on the first insulating layer IL1 The first conductive layer 110 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single film or a multilayer film. The first conductive layer 110 may include the first main fan-out wire 111 and the first sub-fan-out wire 112 of the above-described first fan-out wire F1, a gate electrode of a transistor, and a first electrode of a storage capacitor.

The second insulating layer IL2 may be disposed on the first conductive layer 110. The second insulating layer IL2 may be disposed on the surface (or substantially entire) surface of the substrate 101. The second insulating layer IL2 serves to insulate the first conductive layer 110 from the second conductive layer 120.

The second insulating layer IL2 may be an interlayer insulating film. The second insulating layer IL2 may include the same material as the first insulating layer IL1 The second insulating layer IL2 may include at least one material selected from among the materials described as the structural materials of the first insulating layer IL1.

The second conductive layer 120 may be disposed on the second insulating layer IL2. The second conductive layer 120 may include a second electrode of the storage capacitor. The second conductive layer 120 may form the storage capacitor by overlapping the first conductive layer 110 with the second insulating layer IL2 interposed therebetween. The second conductive layer 120 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 120 may include the same material as the first conductive layer 110. But, the disclosure is not limited thereto. The second conductive layer 120 may be a single film or a multilayer film. The second conductive layer 120 may include the second main fan-out wires 121 and the second sub-fan-out wires 122 of the second fan-out wires F2.

The third insulating layer IL3 may cover the second conductive layer 120. The third insulating layer IL3 may insulate the second conductive layer 120 from the third conductive layer 130. The third insulating layer IL3 may include the same material as the first insulating layer IL1 The third insulating layer IL3 may include at least one material selected from among the materials described as the structural materials of the first insulating layer IL1.

The third conductive layer 130 may be disposed on the third insulating layer IL3. The third conductive layer 130 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 130 may be a single film or a multilayer film. For example, the third conductive layer 130 may have a stacked structure of Ti/Al/Ti, Mo/Al/Mo, Mo/AlGe/Mo, Ti/Cu, or the like. As shown in FIG. 12, for example, the third conductive layer 130 may include a signal wire DL, a source electrode SE, and a drain electrode DE. The source electrode SE and the drain electrode DE may be respectively connected to the source area and the drain area of the semiconductor layer ACT through contact holes passing through the third insulating layer IL3, the second insulating layer IL2, and the first insulating layer IL1.

The fourth insulating layer IL4 may cover the third conductive layer 130. The fourth insulating layer IL4 may be a via layer. The fourth insulating layer IL4 may include an organic insulating material such as a polyacrylate-based resin, epoxy resin, phenolic resin, a polyamide-based resin, a polyimide-based resin, a unsaturated polyester-based resin, a polyphenylenether-based resin, a polyphenylene sulfide-based resin, or benzocyclobutene (BCB).

The fourth conductive layer 140 may be disposed on the fourth insulating layer IL4. The fourth conductive layer 140 may include the same material as the third conductive layer 130. The fourth conductive layer 140 may include at least one material selected from among the materials described as the structural materials of the third conductive layer 130. The fourth conductive layer 140 may include the above-described connection wire DM and bending fan-out wire 141.

The fifth insulating layer IL5 may be disposed on the fourth conductive layer 140. The fifth insulating layer IL5 may be a via layer. The fifth insulating layer IL5 may include the same material as the fourth insulating layer IL4. The fifth insulating layer IL5 may include at least one material selected from among the materials described as the structural materials of the fourth insulating layer IL4.

The first electrode layer 171 may be disposed on the fifth insulating layer IL5. The first electrode layer 171 may have a stacked film structure formed by stacking a material layer having a high work function and a reflective material layer. The material layer having the high work function may be made of or include at least one selected from among indium tin oxide (ITO), indium zinc oxide (IZO), zinc oxide (ZnO), and indium oxide (In2O3). The reflective material layer may be made of or include one selected from among silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), and mixtures thereof. The material layer having the high work function may be disposed on the reflective material layer and may be disposed close to the light-emitting layer 172. The first electrode layer 171 may have a multilayer structure of ITO/Mg, ITO/MgF, ITO/Ag, or ITO/Ag/ITO, but the embodiments are not limited thereto. An anode electrode of the pixels may be formed of the first electrode layer 171. The anode electrode may be connected to the drain electrode DE through a contact hole passing through the fourth insulating layer IL4.

The pixel definition film 160 may be disposed on the first electrode layer 171. The pixel definition film 160 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylate-based resin, epoxy resin, phenolic resin, a polyamide-based resin, polyimide-based resin, a unsaturated polyester-based resin, a polyphenylenether-based resin, a polyphenylene sulfide-based resin, or BCB. The pixel definition film 160 may be a single film or a multilayer film including stacked films made of different materials.

The pixel definition film 160 may include the opening that exposes the first electrode layer 171. The opening may define a light-emitting area of each of the subpixels R, G1, G2, and B.

The light-emitting layer 172 may be disposed in the opening of the pixel definition film 160. The light-emitting layer 172 may include an organic light-emitting layer, a hole injecting/transporting layer, and an electron injecting/transporting layer.

The second electrode layer 173 may be disposed on the light-emitting layer 172 and the pixel definition film 160. A cathode electrode may be formed of the second electrode layer 173. The cathode electrode may be disposed in the display area DA. In an embodiment, the cathode electrode may be disposed in the entire (or substantially entire) display area DA. The second electrode layer 173 may include a material layer having a low work function, which is made of or include one selected from among Li, Ca, LiF/Ca, LiF/Al, Al, Mg, Ag, Pt, Pd, Ni, Au, Nd, Ir, Cr, BaF, Ba, and a compound or mixture thereof. The second electrode layer 173 may further include a transparent metal oxide layer disposed on the material layer having the low work function.

The passivation layer 170 may be disposed on the second electrode layer 173. The passivation layer 170 may prevent moisture or oxygen from permeating into the light-emitting layer 172. The passivation layer 170 may include at least one inorganic film and/or organic film. The inorganic film may include, for example, at least one inorganic material selected from among $Al_xO_y$, $TiO_x$, $ZrO_x$, $SiO_x$, $AlO_xN_y$, $Al_xN_y$, $SiO_xN_y$, $Si_xN_y$, $ZnO_x$, and $Ta_xO_y$. For example, the organic layer may be formed by polymerizing at least one monomer selected from the group consisting of pentabromophenyl acrylate, 2-(9H-carbazol-9-yl)ethyl methacrylate, N-vinylcarbazole, bis(methacryloylthiophenyl)sulfide, and zirconium acrylate. The organic film may be a planarization film.

The touch sensing layer TSL may be disposed on the passivation layer 170.

The touch sensing layer TSL may include a first touch insulating layer TIL1 the first touch conductive layer 151, the second touch insulating layer TIL2, the second touch conductive layer 152, and a touch protective layer 180.

Each of the above-described layers may be formed as a single film but may also be formed as a stacked film including a plurality of films. Other layers may be further disposed between the above-described layers.

The first touch insulating layer TIL1 may include an organic film and/or an inorganic film. For example, the organic film may include at least one selected from among an acrylic-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. For example, the inorganic film may include at least one selected from among aluminum oxide, titanium oxide, silicon oxide, silicon oxynitride, zirconium oxide, and hafnium oxide.

The first touch conductive layer 151 may be disposed on the first touch insulating layer TIL1 The first touch conductive layer 151 may include at least one selected from among molybdenum, titanium, copper, aluminum, and an alloy thereof. The first touch conductive layer 151 may include the connection electrodes BE. As described above, the first touch conductive layer 151 constituting or including the connection electrodes BE may have a mesh shape. The first touch conductive layer 151 may not be visible to a user. In order to prevent a reduction in aperture ratio of the pixel PX, the connection electrodes BE may be disposed to overlap the pixel definition film 160.

The second touch insulating layer TIL2 may be disposed on the first touch conductive layer 151. The second touch insulating layer TIL2 may insulate the first touch conductive layer 151 from the second touch conductive layer 152. The second touch insulating layer TIL2 may include the same material as the first touch insulating layer TIL1 The second touch insulating layer TIL2 may include at least one material selected from among the materials described as the structural materials of the first touch insulating layer TIL1.

The second touch conductive layer 152 may be disposed on the second touch insulating layer TIL2. The second touch conductive layer 152 may include the same material as the first touch conductive layer 151. The second touch conductive layer 152 may include at least one material selected from among the materials described as the structural materials of the first touch conductive layer 151. The second touch conductive layer 152 may include the above-described first touch electrodes TE and second touch electrodes RE. As described above, the second touch conductive layer 152 constituting or including the first touch electrodes TE and the second touch electrodes RE may have a mesh shape. The second touch conductive layer 152 may not be visible to a user. In order to prevent a reduction in aperture ratio of the pixel PX, the first touch electrodes TE and the second touch electrodes RE may be disposed to overlap the pixel definition film 160.

The touch protective layer 180 may be disposed on the second touch conductive layer 152. The touch protective layer 180 may include the same material as the first touch insulating layer TIL1 The touch protective layer 180 may include at least one material selected from among the materials described as the structural materials of the first touch insulating layer TIL1.

In the following embodiments, the same components as the above-described components will be denoted by the same reference numerals, and repetitive descriptions thereof will be omitted or simplified.

Figure 16:
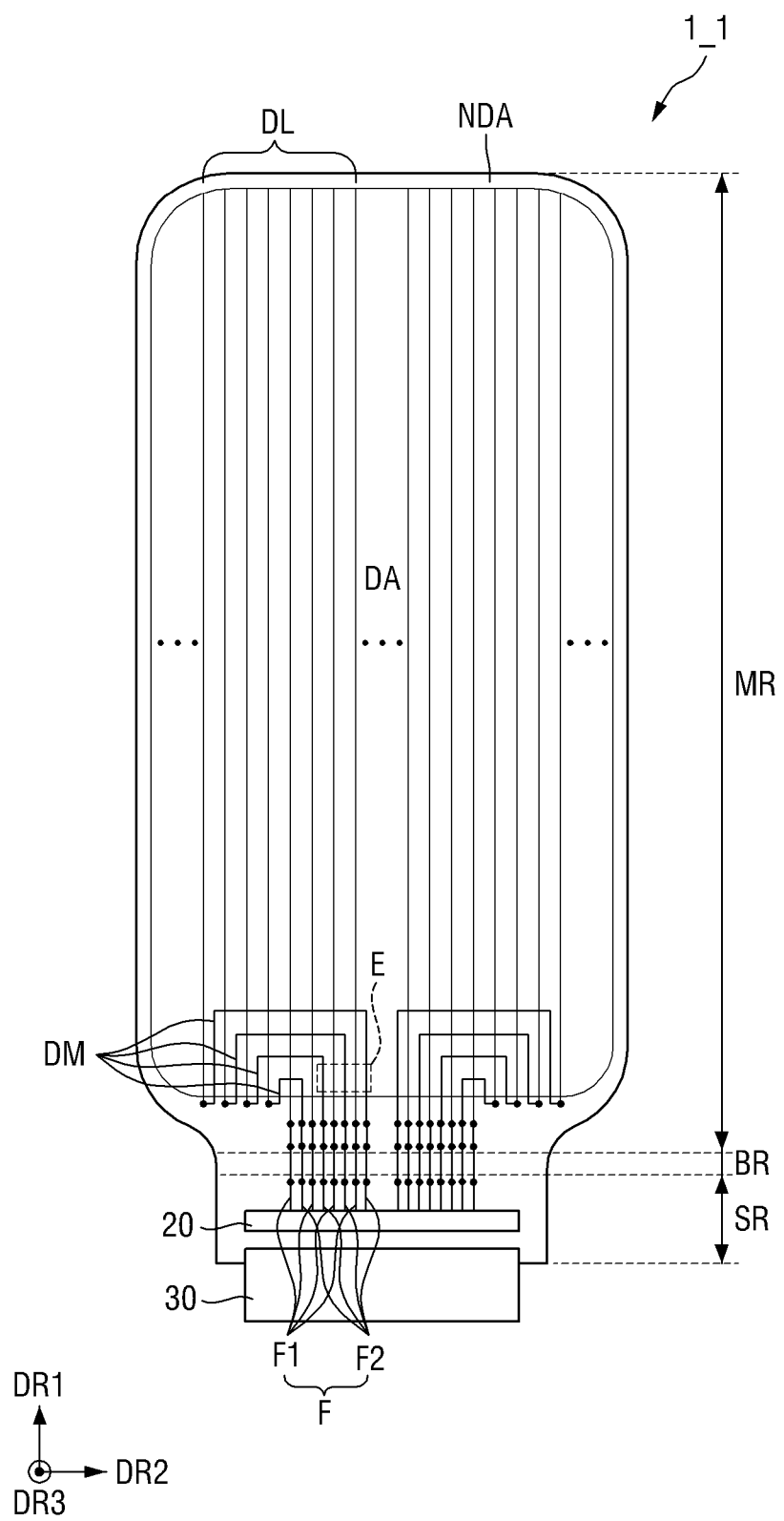
FIG. 16 is a plan view illustrating a display device according to another embodiment.
Figure 17:
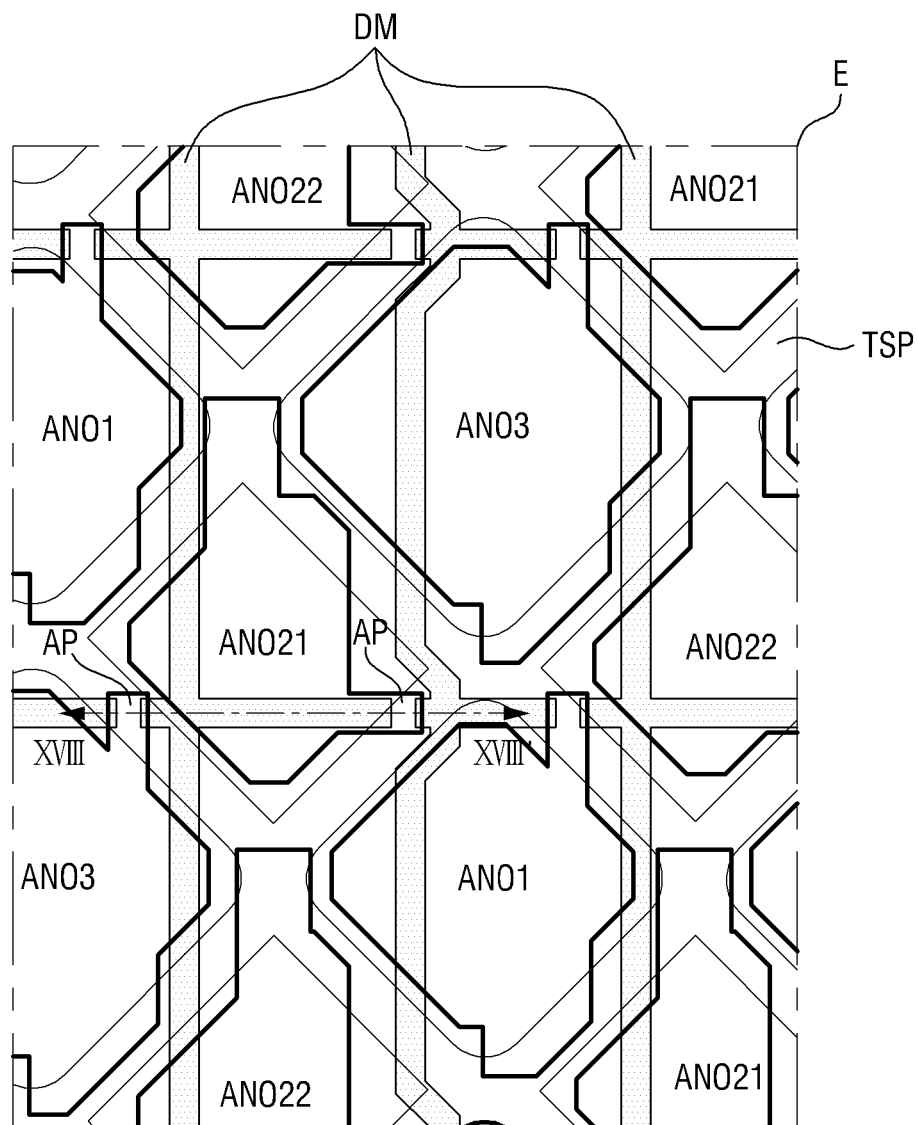
FIG. 17 is an enlarged view illustrating area E of FIG. 16.
Figure 18:
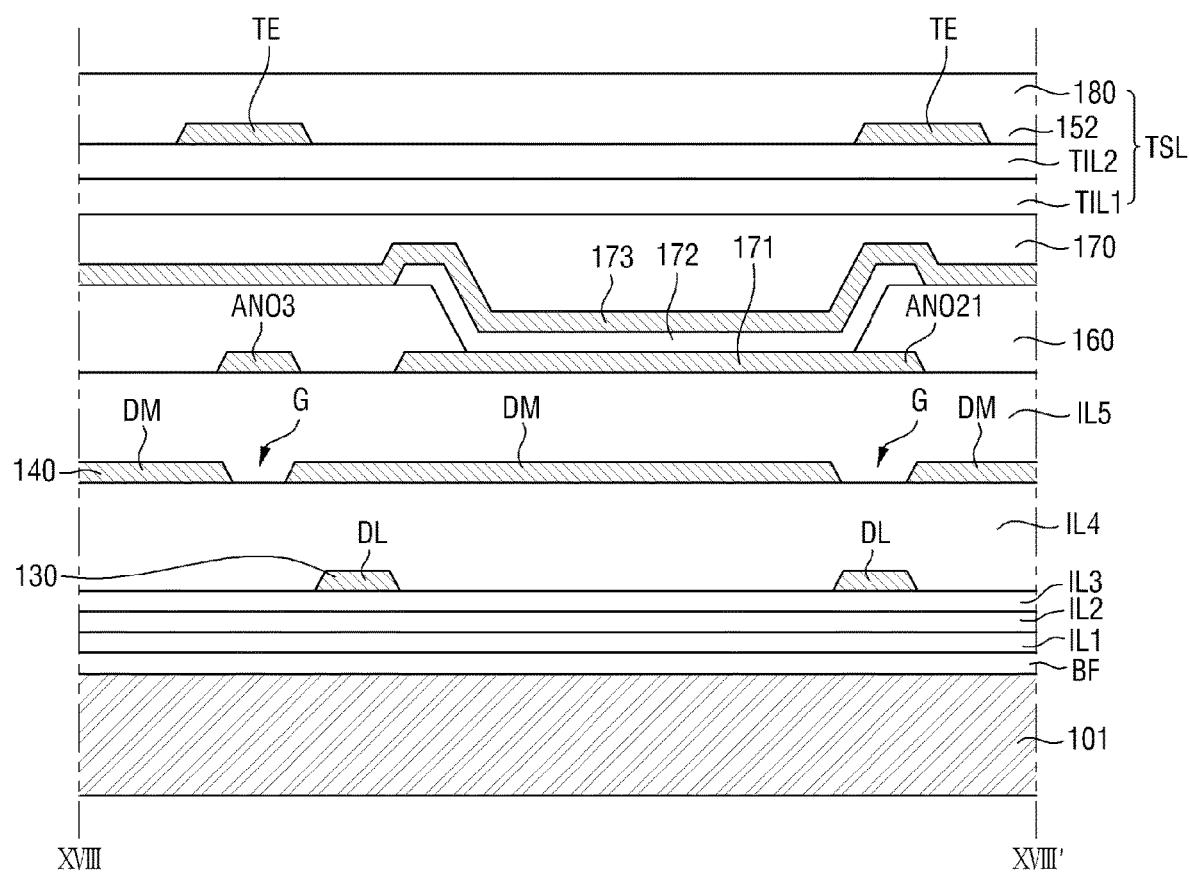
FIG. 18 is a schematic cross-sectional view taken along line XVIII-XVIII' of FIG. 17.

FIG. 16 is a plan view illustrating a display device 1_1 according to another embodiment. FIG. 17 is an enlarged view illustrating area E of FIG. 16. FIG. 18 is a schematic cross-sectional view taken along line XVIII-XVIII' of FIG. 17.

Referring to FIGS. 16 to 18, the embodiment is different from the embodiment of FIGS. 1 to 15. In the display device 1_1, anode electrodes ANO1, ANO21, ANO22, and ANO3 of subpixels R, G1, G2, and B may overlap gaps G between protrusion patterns PP1 and PP2.

The anode electrodes ANO1, ANO21, ANO22, and ANO3 may include a first anode electrode ANO1, second anode electrodes ANO21 and ANO22, and a third anode electrode ANO3.

The first anode electrode ANO1 may be disposed corresponding to a first subpixel R, the second anode electrodes ANO21 and ANO22 may be disposed corresponding to second subpixels G1 and G2, and the third anode electrode ANO3 may be disposed corresponding to a third subpixel B. The second anode electrodes ANO21 and ANO22 may include a second-A anode electrode ANO21 corresponding to a second-A subpixel G1 and a second-B anode electrode ANO22 corresponding to a second-B subpixel G2. Each of the anode electrodes ANO1, ANO21, ANO22, and ANO3 may be implemented with the first electrode layer 171. The first electrode layer 171 may include the anode electrodes ANO1, ANO21, ANO22, and ANO3.

Each of the anode electrodes ANO1, ANO21, ANO22, and ANO3 may include a protrusion AP.

The protrusion AP of the first anode electrode ANO1 may protrude from the first anode electrode ANO1 in the first direction DR1, the protrusions AP of the second anode electrodes ANO21 and ANO22 may protrude from the second anode electrodes ANO21 and ANO22 in the second direction DR2, and the protrusion AP of the third anode electrode ANO3 may protrude from the third anode electrode ANO3 in the first direction DR1.

The protrusions AP of the anode electrodes ANO1, ANO21, ANO22, and ANO3 may overlap the gaps G between the protrusion patterns PP1 and PP2. The gaps G between the protrusion patterns PP1 and PP2 may overlap the touch electrodes TSP as well as the protrusions AP of the anode electrodes ANO1, ANO21, ANO22, and ANO3. The gaps G formed in a display area DA may be blocked twice by the protrusions AP of the anode electrodes ANO1, ANO21, ANO22, and ANO3 and the touch electrodes TSP, thereby more effectively preventing a phenomenon such as reflection of external light from the gaps G and/or visibility of a spot.

The positions and directions in which the protrusions AP of the anode electrodes ANO1, ANO21, ANO22, and ANO3 protrude are not limited to the embodiment shown in FIG. 17. The positions and directions in which the protrusions AP protrude may be variously modified as long as the anode electrodes ANO1, ANO21, ANO22, and ANO3 may overlap the gaps G between the protrusion patterns PP1 and PP2.

Figure 19:
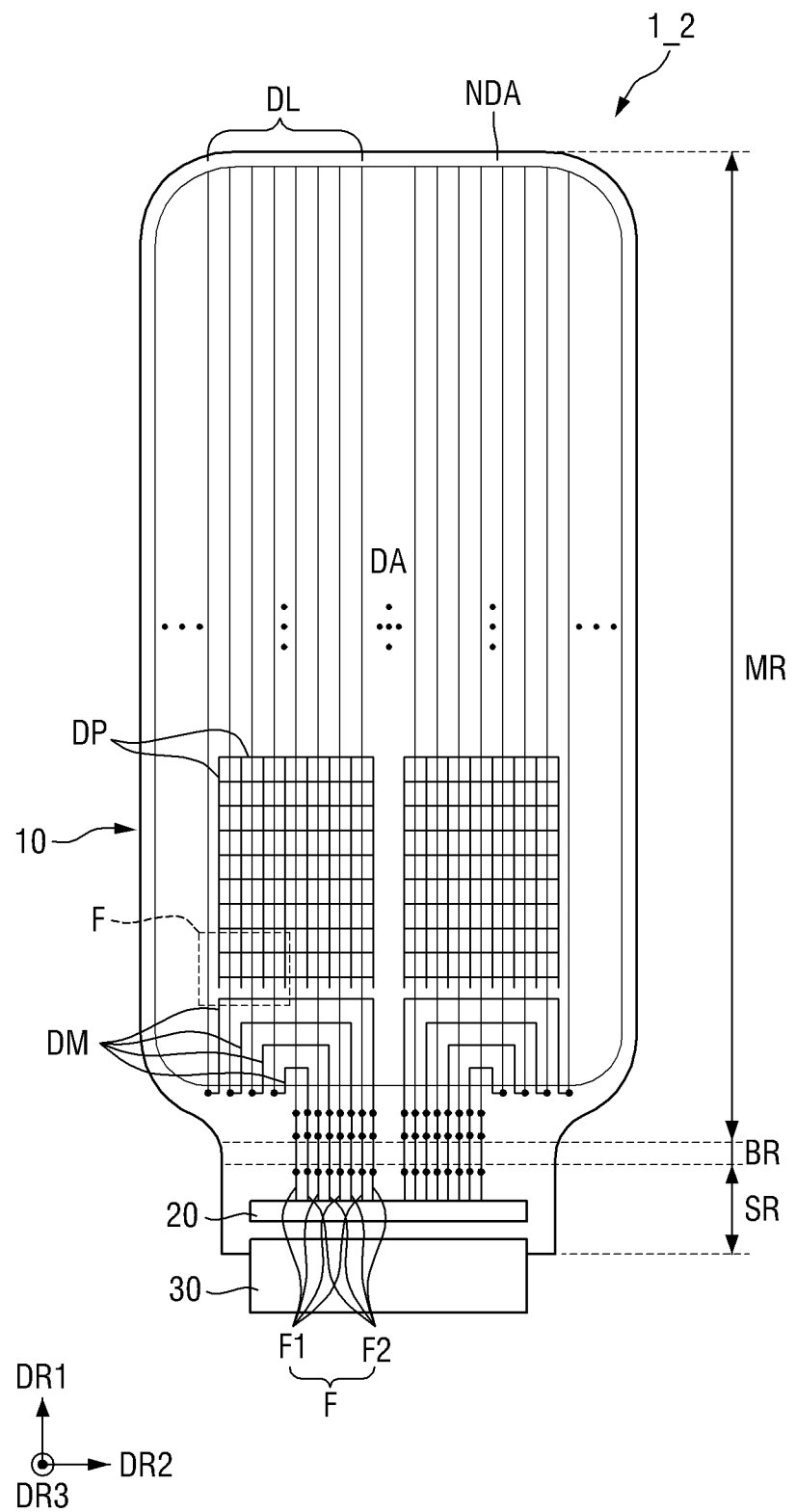
FIG. 19 is a plan view illustrating signal wires, connection wires, and fan-out wires of a display device according to another embodiment.
Figure 20:
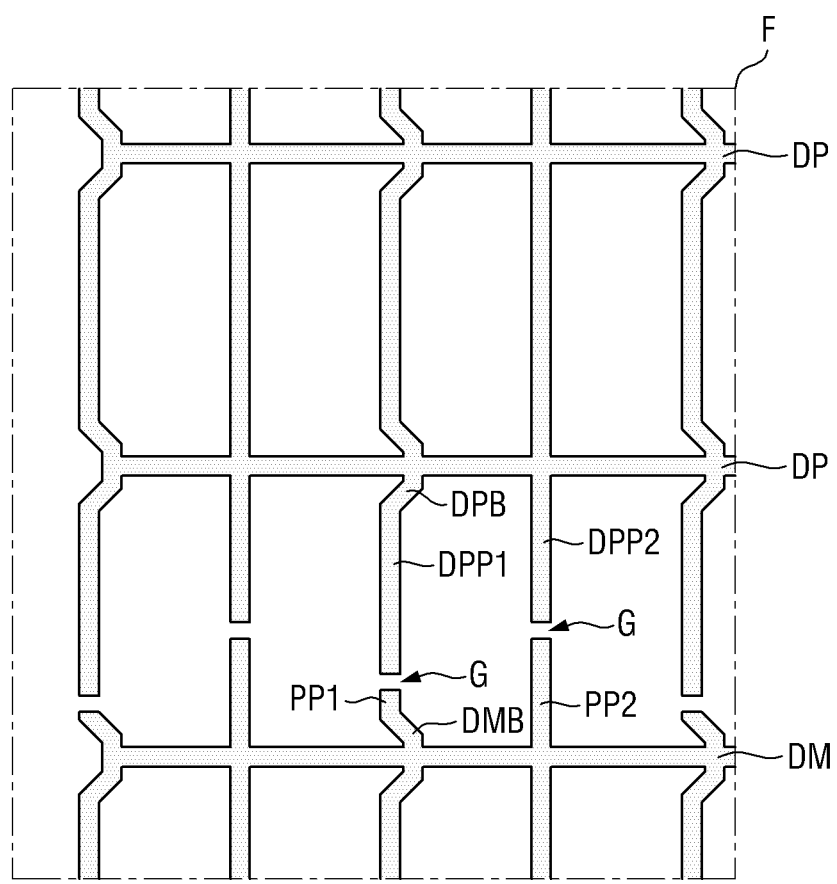
FIG. 20 is an enlarged view illustrating area F of FIG. 19.
Figure 20:
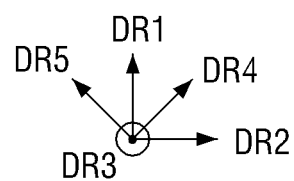
Figure 21:
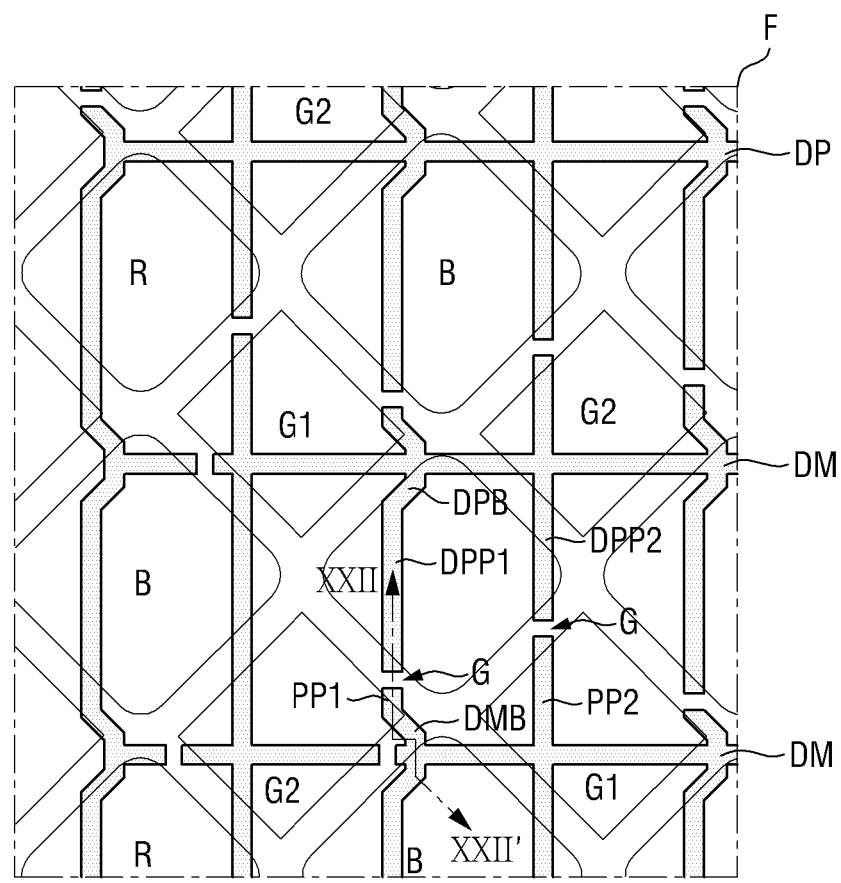
FIG. 21 is an enlarged view illustrating area F of FIG. 19 in which a touch sensing layer is applied.
Figure 21:
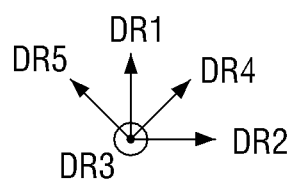
Figure 22:
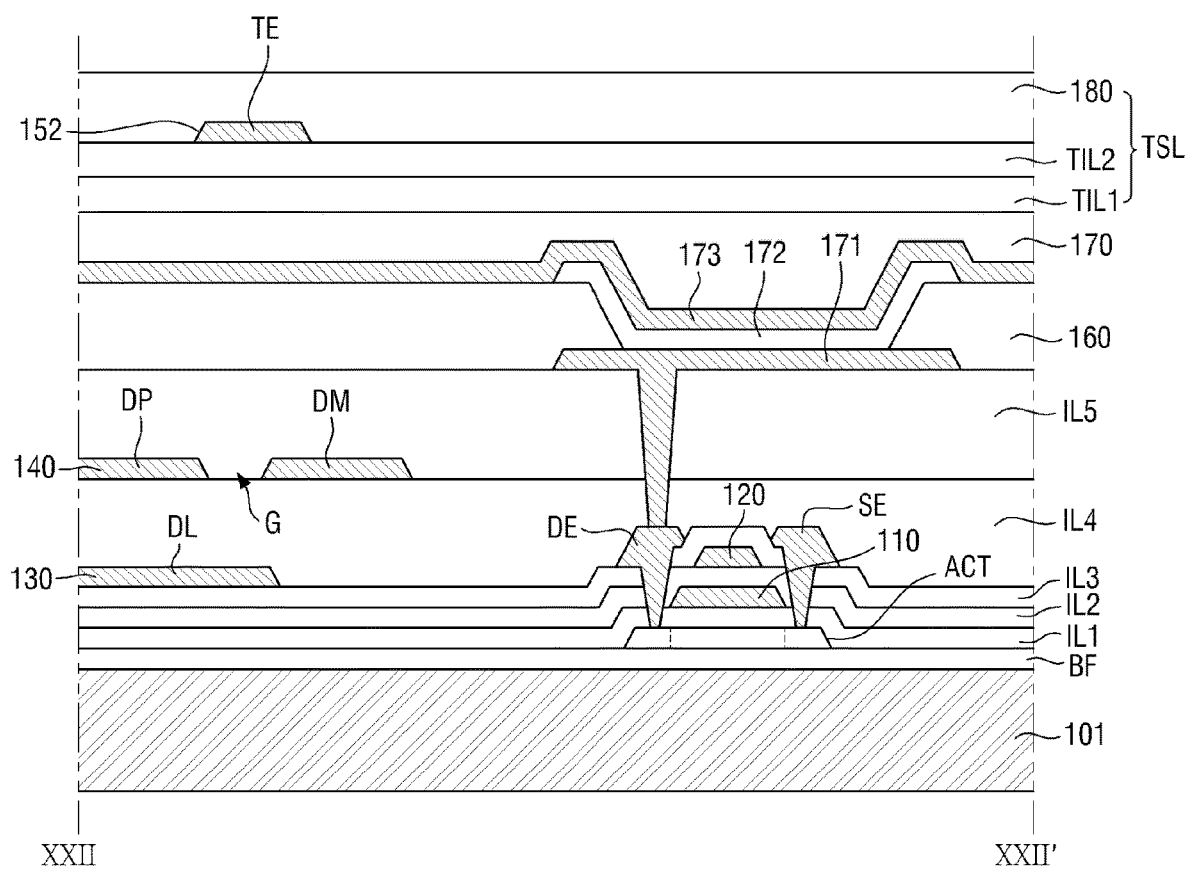
FIG. 22 is a schematic cross-sectional view taken along line XXII-XXII' of FIG. 21.

FIG. 19 is a plan view illustrating signal wires DL, connection wires DM, and fan-out wires F of a display device 1_2 according to another embodiment. FIG. 20 is an enlarged view illustrating area F of FIG. 19. FIG. 21 is an enlarged view illustrating area F of FIG. 19 in which a touch sensing layer is applied. FIG. 22 is a schematic cross-sectional view taken along line XXII-XXII' of FIG. 21.

Referring to FIGS. 19 to 22, the embodiment is different from the embodiment of FIGS. 1 to 15. The display device 1_2 may further include dummy patterns DP.

The dummy patterns DP may be disposed in a display area DA and may be spaced apart from the connection wires DM.

The dummy patterns DP may be disposed around the connection wires DM to have a grid pattern shape together with the connection wires DM.

The dummy patterns DP may be partially bent and include a diagonal portion DPB extending in a diagonal direction. The diagonal portion DPB may be a portion in which a dummy pattern DP is bent in a first diagonal direction DR4 or a second diagonal direction DR5.

As shown in FIG. 20, the diagonal portion DPB may have a shape which is bent in the first diagonal direction DR4 and/or the second diagonal direction DR5 from an end of a dummy pattern DP which extends in the first direction DR1.

The diagonal portion DPB may have a shape protruding from a side of the dummy pattern DP. For example, as shown in FIG. 20, the diagonal portion DPB may protrude from a side of the dummy pattern DP in a direction opposite to the first diagonal direction DR4.

The dummy pattern DP may include dummy protrusion patterns DPP1 and DPP2 protruding from a side of the dummy pattern DP. The dummy protrusion patterns DPP1 and DPP2 may include first dummy protrusion patterns DPP1 protruding from the diagonal portion DPB and second dummy protrusion patterns DPP2 protruding from an extension portion of the respective dummy patterns DP. The extension portion may include portions of a dummy pattern DP excluding the diagonal portion DPB. For example, the extension portion o f a dummy pattern DP may be any portion of the dummy pattern DP excluding the diagonal portion DPB.

Each of the first dummy protrusion patterns DPP1 may have a shape protruding from a side of the diagonal portion DPB. The first dummy protrusion patterns DPP1 may protrude in a direction opposite to the first direction DR1.

Each of the second dummy protrusion patterns DPP2 may have a shape protruding from the extension portion of the dummy pattern DP. The second dummy protrusion patterns DPP2 may protrude in a direction opposite to the first direction DR1.

Parts (or end parts) of the dummy protrusion patterns DPP1 and DPP2 of the dummy pattern DP and the parts (or end parts) of the protrusion patterns PP1 and PP2 of the connection wire DM may be adjacent to each other and may face each other. The parts of the dummy protrusion patterns DPP1 and DPP2 and the parts of the protrusion patterns PP1 and PP2 which are adjacent each other may overlap the touch electrodes TSP.

Gaps G may be defined between the parts (or end parts) of the dummy protrusion patterns DPP1 and DPP2 and the parts (or end parts) of the protrusion patterns PP1 and PP2, which are adjacent to each other. The gaps G between the adjacent parts of the dummy protrusion patterns DPP1 and DPP2 and the protrusion patterns PP1 and PP2 may overlap the touch electrodes TSP. The gaps G may overlap first touch electrodes TE, second touch electrode RE, or connection electrodes BE.

A width of the gaps G between the dummy protrusion patterns DPP1 and DPP2 and the protrusion patterns PP1 or PP2 may be smaller than a line width of the touch electrodes TSP. The width of the gaps G may be smaller than a line width of the dummy patterns DP. The width of the gaps G may be a distance between the parts (or end parts) of the dummy protrusion patterns DPP1 and DPP2 and the parts (or end parts) of the protrusion patterns PP1 or PP2, which face each other.

The width of the gaps G may be in a range of about 2.0 µm to about 3.0 µm. The line width of the touch electrode TSP may be in a range of about 3.2 µm to about 4.8 µm.

However, the disclosure is not limited thereto. In other embodiments, for example, the line width of the touch electrodes TSP may be in a range of about 4.8 µm to about 7.2 µm. An area in which the touch electrodes TSP overlap the gaps G may be increased, thereby more effectively preventing a phenomenon such as reflection of external light from the gaps G and/or visibility of a spot. The line width of the dummy patterns DP may be in a range of about 2.4 µm to about 3.6 µm. However, the width of the gaps G and the line width of the wires are not limited thereto, and the range thereof is not limited thereto as long as the gaps G between the dummy protrusion patterns DPP1 and DPP2 and the protrusion patterns PP1 and PP2 overlap the touch electrodes TSP. Since the gaps G between the dummy protrusion patterns DPP1 and DPP2 and the protrusion patterns PP1 and PP2 overlap the touch electrodes TSP, the gaps G formed in the display area DA may be blocked by the touch electrodes TSP. Therefore, it is possible to prevent a phenomenon such as reflection of external light from the gaps G and/or visibility of a spot.

The first dummy protrusion patterns DPP1 and the second dummy protrusion patterns DPP2 may be alternately disposed in the second direction DR2. The first dummy protrusion patterns DPP1 may be disposed between the second dummy protrusion patterns DPP2.

The first dummy protrusion patterns DPP1 and/or the second dummy protrusion patterns DPP2 may be disposed at an interval in the second direction DR2. For example, an interval between the dummy protrusion patterns DPP1 and DPP2 disposed in the second direction DR2 may be substantially the same as an interval between the connection wires DM disposed in the second direction DR2.

The dummy patterns DP and the connection wires DM may be disposed to be coplanar. For example, as shown in FIG. 22, the dummy patterns DP may be implemented with a fourth conductive layer 140. The fourth conductive layer 140 may include the dummy patterns DP. However, the disclosure is not limited thereto. In other embodiments, the dummy patterns DP may be implemented with a different conductive layer from the connection wire DM.

In the display device 1_2 including the dummy patterns DP, the dummy patterns DP may have a grid pattern shape in the display area DA together with the connection wires DM. Accordingly, an anomalous pattern around the connection wires DM may be minimized to prevent a phenomenon in which the connection wire DM is visible.

Figure 23:
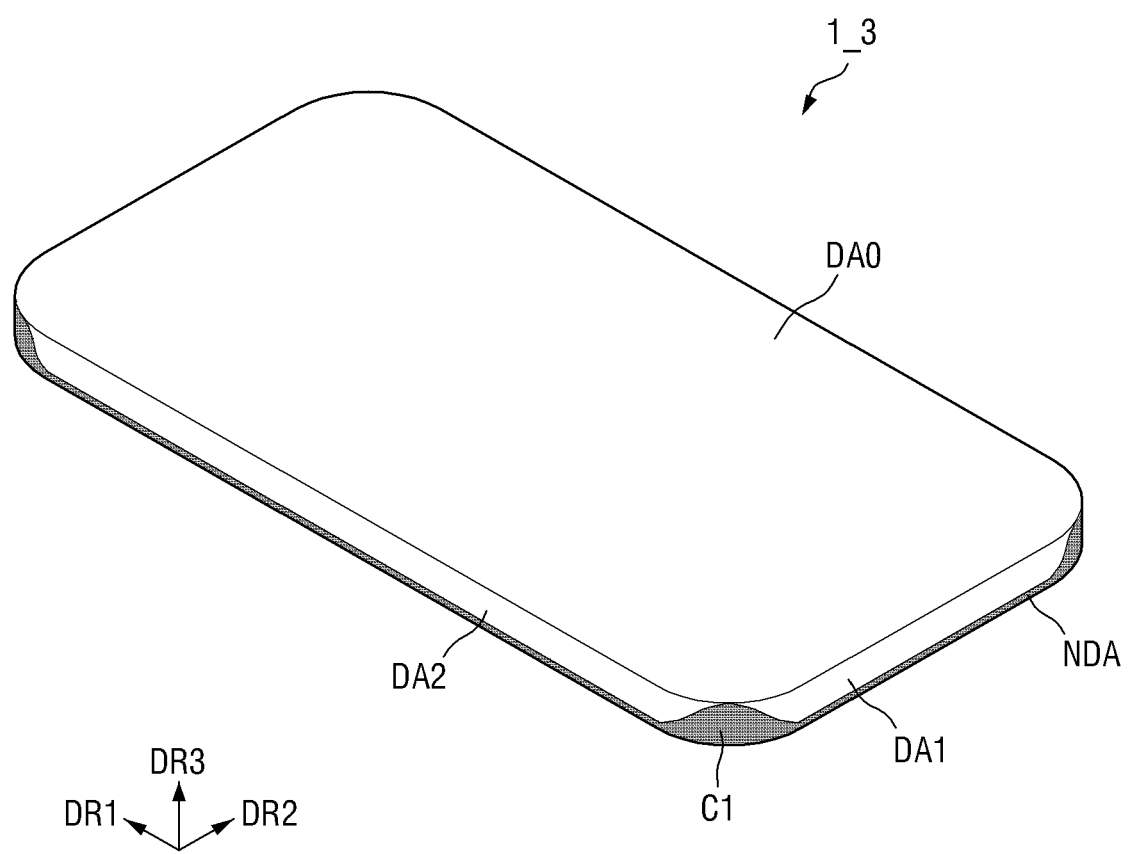
FIG. 23 is a perspective view illustrating a display device according to another embodiment.
Figure 24:
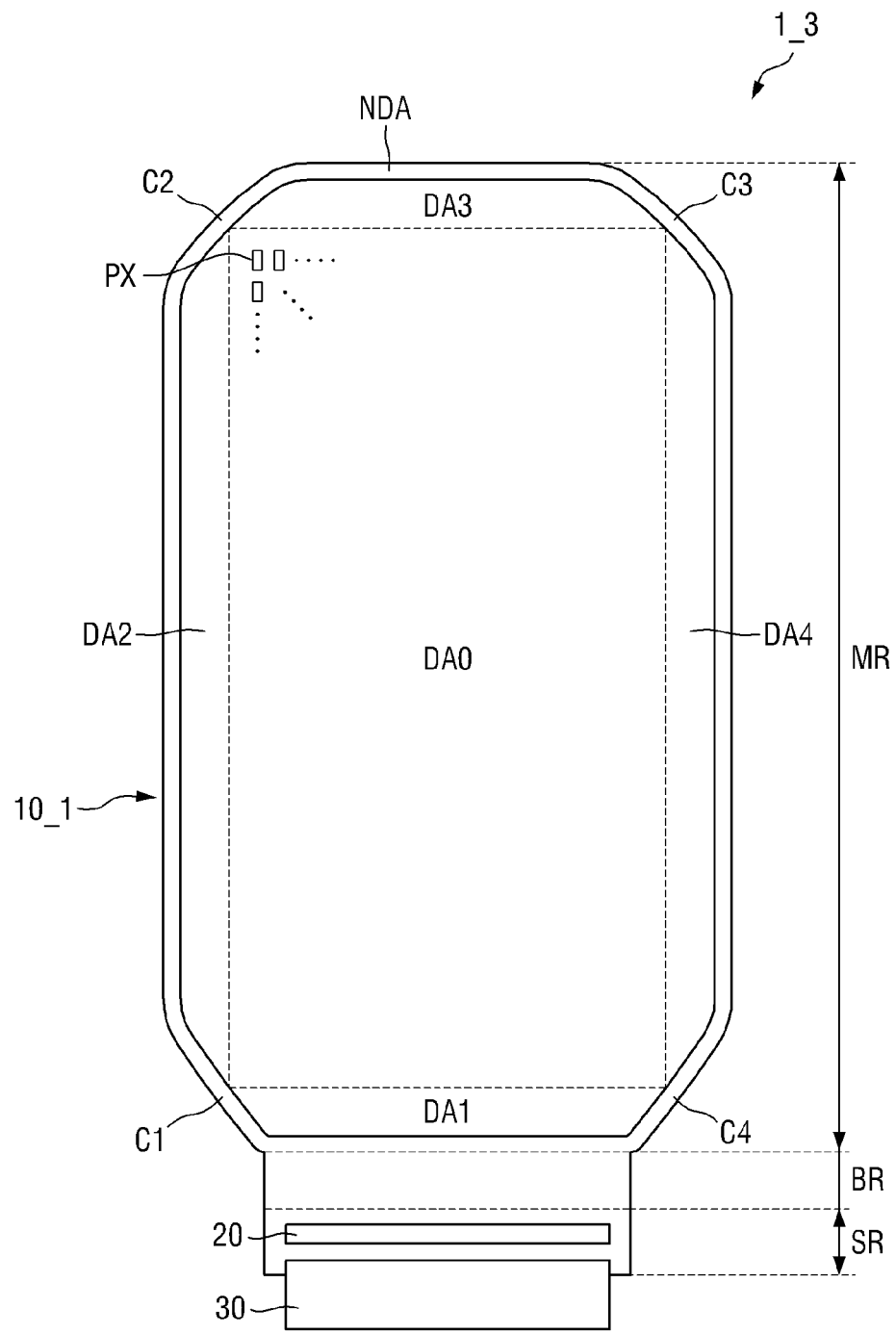
FIG. 24 is a plan view illustrating the display device of FIG. 23.
Figure 25:
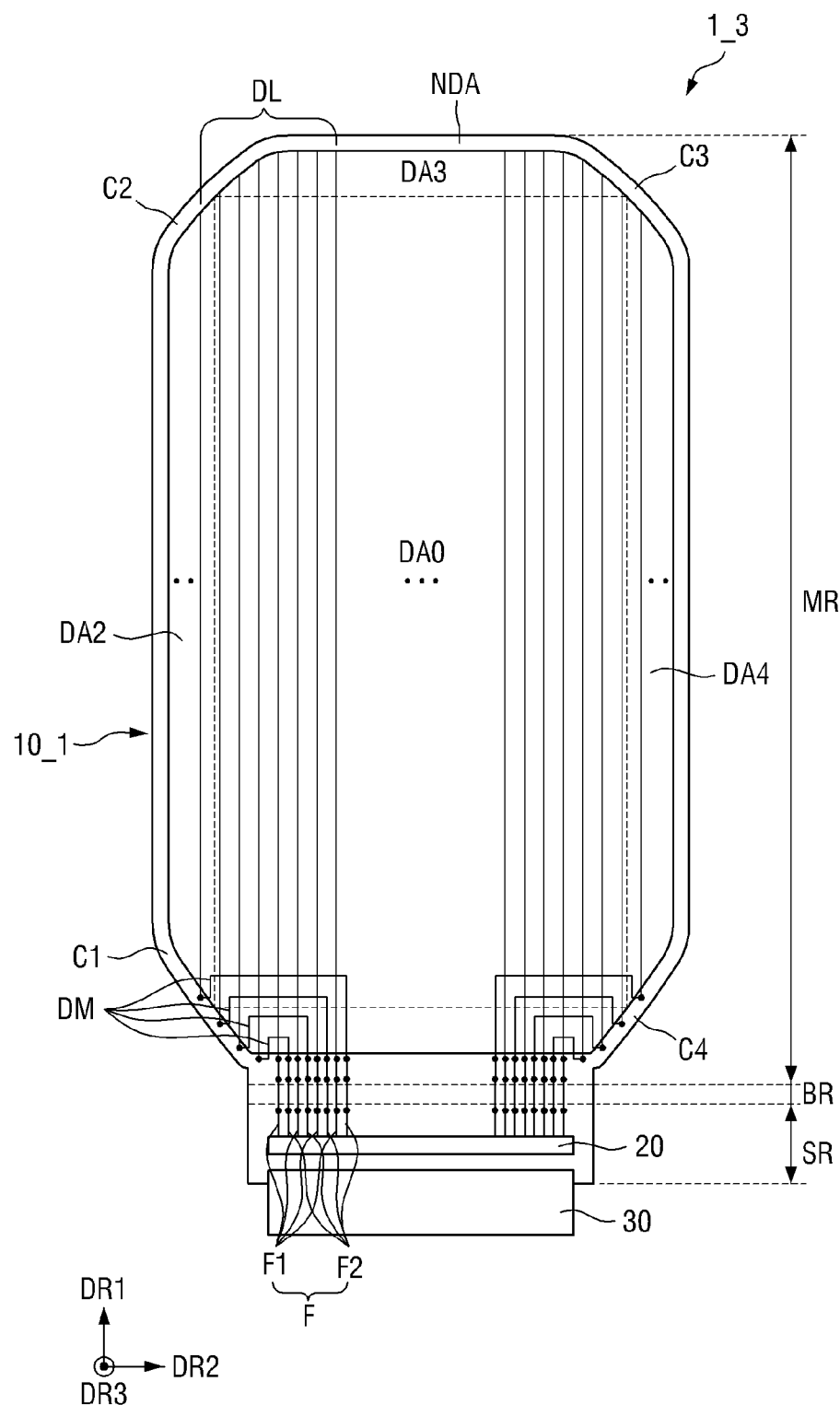
FIG. 25 is a plan view illustrating signal wires, connection wires, and fan-out wires of the display device of FIG. 23.

FIG. 23 is a perspective view illustrating a display device according to another embodiment. FIG. 24 is a plan view illustrating the display device 1_3 of FIG. 23. FIG. 25 is a plan view illustrating signal wires DL, connection wires DM, and fan-out wires F of the display device 1_3 of FIG. 23.

Referring to FIGS. 23 to 25, the embodiment is different from the embodiment of FIGS. 1 to 15. In the display device 1_3, a main area MR of a display panel 10_1 may include a front display area DA0, side display areas DA1, DA2, DA3, and DA4, and corner areas C1, C2, C3, and C4.

The front display area DA0 and the side display areas DA1, DA2, DA3, and DA4 may be display areas DA in which images may be displayed. The corner areas C1, C2, C3, and C4 are non-display areas NDA in which no image is displayed. The corner areas C1, C2, C3, and C4 may provide spaces through which signal wires DL and connection wires DM may pass.

The front display area DA0 may have a rectangular shape which includes two long sides extending in a first direction DR1 and two short sides extending in a second direction DR2. However, the embodiments are not limited thereto. In other embodiments, a corner at which the short side and the long side meet may have a rounded polygonal shape.

The side display areas DA1, DA2, DA3, and DA4 may include a first side display area DA1, a second side display area DA2, a third side display area DA3, and a fourth side display area DA4.

The first side display area DA1 may be an area extending from an edge of the front display area DA0 in a direction opposite to the first direction DR1. The second side display area DA2 may be an area extending from the edge of the front display area DA0 in a direction opposite to the second direction DR2. The third side display area DA3 may be an area extending from the edge of the front display area DA0 in the first direction DR1. The fourth side display area DA4 may be an area extending from the edge of the front display area DA0 in the second direction DR2.

The first, second, third, and fourth side display areas DA1, DA2, DA3, and DA4 may be structured or configured in a similar manner, except for positions thereof. Hereinafter, common features of the first, second, third, and fourth side display areas DA1, DA2, DA3, and DA4 will be described based on the first side display area DA1, and repetitive descriptions thereof will be omitted.

The first side display area DA1 may extend outward from the edge of the front display area DA0 and may be bent at a predetermined or selected angle. For example, the first side display area DA1 may be bent at an angle in a range from about 90° to about 150° with respect to the front display area DA0.

The first side display area DA1 may be connected to a bent area BR. As shown in FIG. 23 and FIG. 24, when the first side display area DA1 is bent (for example, at a right angle) with respect to the front display area DA0, the bent area BR may be bent (for example, at a right angle) once more with respect to the first side display area DA1. The bent area BR may be bent (for example, at an angle of about) 180° with respect to the front display area DA0. Accordingly, a sub-area SR disposed at a side of the bent area BR may be disposed below the front display area DA0 in a thickness direction of the front display area DA0. The sub-area SR may overlap the front display area DA0 and may be disposed substantially parallel to the front display area DA0.

The corner areas C1, C2, C3, and C4 may be disposed or positioned between the side display areas DA1, DA2, DA3, and DA4. The corner areas C1, C2, C3, and C4 may include first, second, third, and fourth corner areas C1, C2, C3, and C4 disposed or positioned between the first, second, third, and fourth side display areas DA1, DA2, DA3, and DA4. The first, second, third, and fourth corner areas C1, C2, C3, and C4 may be disposed adjacent to four corners at which the long sides and the short sides of the front display area DA0 meet. The first, second, third, and fourth corner areas C1, C2, C3, and C4 may be structured or configured in a similar manner, except for positions thereof. Hereinafter, common features of the first, second, third, and fourth corner areas C1, C2, C3, and C4 will be described based on the first corner area C1, and repetitive descriptions thereof will be omitted.

The first corner area C1 may be disposed or positioned between the first side display area DA1 and the second side display area DA2. An end of the first corner area C1 may be in contact with the first side display area DA1, and another end of the first corner area C1 may be in contact with the second side display area DA2.

The first corner area C1 may extend from the front display area DA0 and may be roundly formed to have a curvature. A curvature of the first corner area C1 with respect to the front display area DA0 may be greater than a curvature of the first side display area DA1 and the second side display area DA2 with respect to the front display area DA0.

The first corner area C1 may provide a space in which the signal wires DL may be connected to the connection wires DM.

The signal wires DL may extend from the first corner area C1 and may be disposed in the side display areas DA1, DA2, DA3, and DA4 and the front display area DA0. The signal wires DL may extend from the non-display area NDA between the first side display area DA1 and the bent area BR and may be disposed in the side display areas DA1, DA2, DA3, and DA4 and the front display area DA0.

The connection wires DM may extend from the non-display area NDA between the first side display area DA1 and the bent area BR and extend to the first corner area C1 via the first side display area DA1, the front display area DA0, or the second side display area DA2.

The connection wires DM may be electrically connected to the signal wires DL in the first corner area C1. The connection wires DM may be electrically connected to the signal wires DL in the non-display area NDA between the first side display area DA1 and the bent area BR.

The display device 1_3 may include the connection wires DM disposed through the display area DA, and image signals may be provided to the signal wires DL through the connection wires DM. Therefore, no additional dead space is required for connecting the signal wires DL to the fan-out wires F.

The fan-out wires F may extend from a driving chip 20 of the sub-area SR to the non-display area NDA of the main area MR.

The fan-out wires F may be electrically connected to the signal wires DL. Some of the fan-out wires F may be connected (or directly connected) to some of the signal wires DL, and the rest of the fan-out wires F may be connected (or directly connected) to the connection wires DM and connected to the signal wires DL by the connection wires DM.

Since the signal wires DL, the connection wires DM, and the fan-out wires F are described above with reference to FIGS. 1 to 15, repetitive descriptions thereof are omitted.

In the above described embodiments, a dead space of a display device can be reduced or minimized as the connection wires are arranged in a display area as described above.

The gaps between the wires can be blocked by the touch electrodes of the touch sensing layer, thereby preventing a phenomenon such as reflection of external light from the gaps and/or visibility of a spot. As a result, display quality can be improved.

Effects of the disclosure are not restricted to the embodiments set forth herein. In concluding the detailed description, those skilled in the art will appreciate that many variations and modifications may be made to the embodiments without substantially departing from the principles and spirit and scope of the. Therefore, the disclosed embodiments are used in a generic and descriptive sense only and not for purposes of limitation.

What is claimed is:

1. A display device comprising:
    a display panel comprising a display area and a non-display area;
    signal wires disposed in the display area;
    connection wires electrically connected to the signal wires; and
    touch electrodes disposed on the connection wires, wherein
    the connection wires comprise:
        a first portion extending from the non-display area to the display area in a first direction;
        a second portion connected to the first portion and extending in a second direction intersecting the first direction;
        a third portion connected to the second portion and extending to the non- display area in a direction opposite to the first direction; and
        protrusion patterns protruding from the at least one of the first portion, the second portion, and the third portion,
    one of the protrusion pattern of the protrusion patterns forms a gap with another of the protrusion pattern of adjacent connection wires, and
    the gap overlaps the touch electrodes.

2. The display device of claim 1, wherein the connection wires further comprise diagonal portions extending from the at least one of the first portion, the second portion, and the third portion.

3. The display device of claim 2, wherein the protrusion patterns comprise:
    first protrusion patterns extending from the diagonal portions; and
    second protrusion patterns extending directly from the at least one of the first portion, the second portion, and the third portion.

4. The display device of claim 1, further comprising anode electrodes disposed between the connection wires and the touch electrodes.

5. The display device of claim 4, further comprising an opening exposing the anode electrodes.

6. The display device of claim 5, wherein the gap does not overlap the opening.

7. The display device of claim 5, further comprising dummy patterns disposed at a side of the connection wires in the display area.

8. The display device of claim 7, wherein the dummy patterns comprise:
    diagonal portions extending in a diagonal direction from the dummy patterns;
    first dummy protrusion patterns protruding from the diagonal portions of the dummy patterns; and
    second dummy protrusion patterns protruding directly from the dummy patterns.

9. The display device of claim 8, wherein one of the first dummy protrusion patterns and the second dummy protrusion patterns forms a gap with adjacent another of the first dummy protrusion patterns and the second dummy protrusion patterns.

10. The display device of claim 9, wherein the gap of the first dummy protrusion patterns and the second dummy protrusion patterns does not overlap the opening.

11. The display device of claim 9, wherein the gap of the first dummy protrusion patterns and the second dummy protrusion patterns overlaps the touch electrodes.

12. The display device of claim 9, wherein a distance between a part of the at least one of the first dummy protrusion patterns and a part of the at least one of the protrusion patterns is smaller than a line width of the touch electrodes.

13. The display device of claim 4, wherein the anode electrodes include protrusions protruding from the anode electrodes in the first direction or the second direction.

14. The display device of claim 13, wherein the protrusions overlap the gap.

15. A display device comprising:
a display panel comprising a display area and a non-display area;
signal wires disposed in the display area;
connection wires electrically connected to the signal wires; and
touch electrodes disposed on the connection wires, wherein
the connection wires comprise:
diagonal portions extending from the connection wires;
first protrusion patterns extending from the diagonal portions; and
second protrusion patterns extending directly from the diagonal portions, and
one end of the first protrusion patterns or one end of the second protrusion patterns overlaps the touch electrodes.

16. The display device of claim 15, wherein one of the first protrusion patterns and second protrusion patterns forms a gap with adjacent another of the first protrusion patterns and second protrusion patterns.

17. The display device of claim 16, wherein the gap overlaps the touch electrodes.

18. The display device of claim 15, wherein the connection wires further comprise:
a first portion extending from the non-display area to the display area in a first direction;
a second portion connected to the first portion and extending in a second direction intersecting the first direction; and
a third portion connected to the second portion and extending to the non-display area in a direction opposite to the first direction.

19. The display device of claim 16, further comprising:
anode electrodes disposed between the connection wires and the touch electrodes; and
an opening exposing the anode electrodes.

20. The display device of claim 19, wherein the gap does not overlap the opening.

* * * * *